US007257230B2

(12) United States Patent
Nagatani

(10) Patent No.: US 7,257,230 B2
(45) Date of Patent: Aug. 14, 2007

(54) IMPULSE RESPONSE COLLECTING METHOD, SOUND EFFECT ADDING APPARATUS, AND RECORDING MEDIUM

(75) Inventor: Shigetaka Nagatani, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/131,791

(22) Filed: May 18, 2005

(65) Prior Publication Data

US 2005/0216211 A1 Sep. 29, 2005

(30) Foreign Application Priority Data

Sep. 24, 1998 (JP) ............................... P10-269917
Sep. 25, 1998 (JP) ............................... P10-271462

(51) Int. Cl.
*H04R 29/00* (2006.01)
*H03G 3/00* (2006.01)

(52) U.S. Cl. ............................ 381/56; 381/61; 381/63

(58) Field of Classification Search ............ 381/61-64, 381/56, 58, 98, 103
See application file for complete search history.

(56) References Cited

U.S. PATENT DOCUMENTS 4,739,513 A * 4/1988 Kunugi et al. .............. 381/103
4,888,808 A * 12/1989 Ishikawa et al. ............ 381/103
6,760,451 B1 * 7/2004 Craven et al. ................ 381/98

* cited by examiner

*Primary Examiner*—Brian T. Pendleton
(74) *Attorney, Agent, or Firm*—Reed Smith, LLP

(57) ABSTRACT

A TSP signal that is a measurement signal is generated N times by a signal generating portion. The generated TSP signals are supplied to a steel-echo apparatus. Reverberation generated by the steel-plate echo apparatus corresponding to the TSP signals is arranged N times corresponding to the start points of the TSP signals and synchronously added by a synchronously adding portion. Generating impluse signal is convoluted by an inverse function to TSP signal. The added result of the synchronously adding portion is supplied to an impulse response converting portion. By dividing the added result by the inverse characteristics of the TSP signals, the added reverberation is converted into an impulse response. The impulse response data obtained by the converting portion is recorded to for example a CD-ROM and supplied to a reverberator. The reverberator reproduces an impulse response recorded on the CD-ROM and performs a convolution calculation process for the input signal. Thus, reverberation of the steel-plate echo apparatus can be reproduced.

7 Claims, 24 Drawing Sheets

IMPULSE RESPONSE COLLECTING METHOD, SOUND EFFECT ADDING APPARATUS, AND RECORDING MEDIUM

BACKGROUND OF THE INVENTION

1. Field of the Invention

The present invention relates to an impulse response collecting method, a sound effect adding apparatus, and a record medium that allow reverberation to be added corresponding to a real apparatus or a real space.

2. Description of the Related Art

As an apparatus that adds a sound effect to an audio signal, a reverberator is known. The reverberator is used to add reverberation to an audio signal in for example a recording studio so that listeners can have a spatial impression and a deep impression. When reverberation is added to an audio signal that has been recorded in a studio or the like, a sound effect performed in a hall and a special effect can be added to the audio signal.

Formerly, to add reverberation to an audio signal, sound was recorded in for example a hall where reverberation was obtained. Alternatively, such as a steel-plate echo apparatus was used to obtain a reverberative effect. In a recent reverberator, such an effect is electrically accomplished. More recently, as digital technologies have advanced, an apparatus that digitally synthesizes reverberation is becoming common.

When reverberation is added to an audio signal by a digital process, for example a recursive digital filter is used. With the recursive digital filter, an input digital audio signal is attenuated and recurred. Thus, reverberation is generated. The generated reverberation is mixed with the original digital audio signal. In reality, initial reflection sound is added at a position delayed by a predetermined time period against direct sound. After a predetermined time period, reverberation is added. The delay time period of the reverberation against the direct sound is referred to as pre-delay. By adjusting the reverberation time, adding sub-reverberation, and finely adjusting the level of reverberation, a variety of types of sound can be generated.

Reverberation in a real hall has a complicated waveform because of various reflections and interferences of sound due to the shape of the hall and the position of a sound source. However, as described above, in the method of which an original digital audio signal is processed with a filter, since the original signal is simply attenuated, the listeners of the resultant signal have an artificial impression about the generated sound. On the other hand, in the method of which an original digital audio signal is recurred by a filter process, after an input signal ceases, since the final pitch of reverberation is equal to the pitch of the inner feed-back loop of a recursive filter. Thus, in this method, natural and high quality reverberation cannot be obtained.

As a method for reproducing a rear sound field along with a front sound field using left and right sound sources is becoming common. This reproducing method is referred to as surround system. In the surround system, a sound field of a movie theater is reproduced. For example, in front of the listener, left and right channels (F-L and F-R) are disposed. Behind the listener, left and right channels (R-L and R-R) are disposed. In addition to the four channels, at the center of the front of the listener, another channel (referred to as C channel) is disposed. The C channel is used to reproduce speeches of actors and actresses. As an optional channel, one channel is disposed at any position. The optional channel is used to reproduce a sound in the ultra low band. Since the information amount of the ultra low band is 1/10 that of each of the other channels, the channel structure of 5 channels plus ultra low band is referred to as 5.1 channel structure.

In addition to movies, when a conventional music performance that has been recorded in the surround system is reproduced in a relevant system, the listener can enjoy the performance with more presence. In the case of a music performance, four channels F-L, F-R, R-L, and R-R are normally used. However, the C channel is not used.

When sound is recorded in a real hall or the like, reverberation can be obtained more naturally. However, in a real hall, parameters with respect to reverberation (such as reverberative time) cannot be varied. In addition, the positions and types (characteristics) of microphones cannot be quickly changed. Moreover, many apparatuses are required. In addition, due to noise of air conditioners, S/N ratio of sound is low. Therefore, there are many problems to be solved in the related art.

Likewise, a mechanical reverberator such as a steel-plate echo apparatus or a spring echo apparatus may be used. However, such apparatuses have problems of aged tolerance and necessity of maintenance. These problems become critical for an apparatus that cannot be obtained due to out-of-fabrication. In addition, such apparatuses are adversely affected by vibration and external noise. The reverberation time cannot be freely adjusted. Moreover, such apparatuses do not have good reproducibility. Furthermore, the weight and size of these apparatuses are large and S/N ratio of obtained sound is not high.

On the other hand, a method for generating reverberation in a real hall or with a steel-plate echo apparatus, collecting an impulse response corresponding to the generated reverberation, and performing a convolution calculation for the collected impulse response and the input data by a filter process has been proposed. Thus, more natural reverberation corresponding to an impulse response of a real space or an apparatus can be obtained.

FIG. 1 shows an example of a structure for performing a convolution calculation for an impulse response in time axis direction using an FIR (Finite Impulse Response) filter. Coefficients of an impulse response are required corresponding to samples of an input digital audio signal. Thus, when the impulse response data of $2^{19}$ points (524,288 points≈512 k points) is obtained with a digital audio signal at a sampling frequency of 48 kHz, the reverberation time becomes around 10 seconds.

In FIG. 1, a digital audio signal is supplied from a termina 310. The number of quantizing bits of the digital audio signal is for example 24. The sampling frequency of the digital audio signal is 48 kHz. The input signal is supplied to 512 k delaying circuits 311 connected in series. Each of the 512 k delaying circuits 311 has a delay of one sample. Output signals of the individual delaying circuits 311 are supplied to respective coefficient multiplying devices 312. Impulse response data of the first point to 512 k-th point is supplied to the delaying circuits 311 with 24 quantizing bits. The coefficient multiplying devices 312 multiply respective output signals of the delaying circuits 311 by respective impulse response data. The multiplied results are added by an adding device 313. The added result is supplied as reverberation data against the input data to a terminal 314.

In the method for performing convolution calculations for impulse response data in time axis direction, a huge number of delaying circuits 311 and coefficient multiplying devices 312 are required.

To solve such a problem, as shown in FIG. 2, a method for converting an input audio digital audio signal and impulse response data into frequency element data corresponding to Fourrier transform method has been proposed.

Referring to FIG. 2, an input digital audio signal is supplied from a terminal 320. Data for samples corresponding to a required reverberation time (namely, data for 512 k points) is stored in a memory 321. Data stored in the memory 321 is supplied to an FFT (Fast Fourrier Transform) circuit 322. The FFT circuit 322 performs fast Fourrier transform for the data received from the memory 321 and outputs frequency element data of for example 0.1 Hz. Likewise, impulse response data is supplied from a terminal 323. The impulse response data is stored in a memory 324. The impulse response data is supplied to an FFT circuit 325. The FFT circuit 355 performs fast Fourier transform for the impulse response data received from the memory 324 and outputs frequency element data. Since the impulse response data is known, the FFT 325 and the memory 324 may be composed of a ROM 326.

Output data of the FFT circuits 322 and 325 is supplied to a multiplying device 327. The multiplying device 327 multiplies the output data of the FFT circuit 322 by the output data of the FFT circuit 325 in such a manner that the frequency components thereof match. The multiplied result is supplied to an IFFT circuit 328. The IFFT circuit 328 performs inversely fast Fourrier transform for the data received from the multiplying device 327 and outputs the resultant data as time axis data to a terminal 329.

In this method, the hardware scale is smaller than that of the convolution calculation method on time axis. However, since input data corresponding to the required reverberation time should be temporarily stored to the memory 321, a delay of output data against input data becomes large.

To solve the above-described problems about the convolution calculation process for an impulse response, a method for dividing impulse response data on time axis and performing a convolution calculation process for input data corresponding to the divided blocks of the impulse response data has been proposed (as Japanese Patent Publicized Publication No. 8-501667). However, in this method, it is not easy to accurately collect impulse response. This related art reference does not mention how to collect an impulse response.

In other words, the reverberation time has been defined as a time period after sound ceases until the sound pressure level attenuates by 60 dB. The reverberation should be recorded in all the level range. Since the reverberation should be generated with signals including a very low level signal, noise tends to enter the reverberation. In addition, it is very difficult for the user to record reverberation in a real hall.

When a music performance is recorded in the surround system, a reverberation corresponding to a sound field formed with sounds of the four channels should be added. Conventionally, two reverberation adding apparatuses that output monaural/stereo signals are used. In addition, to obtain a high quality reverberation, digital reverberation adding apparatuses have been used.

For example, when one sound source on a stage is recorded, the first reverberation adding apparatus adds a reverberation corresponding to F-L and F-R channels that are on the stage side against the listener. In addition, the second reverberation adding apparatus adds a reverberation corresponding to the R-L and R-R channels that are on the rear side against the listener.

Since a reverberation varies position by position, the two reverberation adding apparatuses should be independently set. Thus, to record a sound source in the surround system, since two reverberation adding apparatuses should be used, their operations are inconveniently complicated.

The reverberation as such as in the hall, the sound is reflected and interfered with the structure of the hall or the position of sound sources then, the waveform becomes more complicated. As mentioned before, attenuated waveforms can be only gained by a filter processing method of the former digital audio signal so, there is a problem of hardly eliminating an artificial impression with the sound On the other hand, a sound source having a particular sound field should be recorded in stereo. In this case, reverberation adding apparatuses corresponding to the stereo input signals are used. However, since conventional reverberation adding apparatuses corresponding to stereo input signals artificially generate stereo sounds, their sounds are unnatural.

To obtain a more natural reverberation, a sound source may be recorded in a real hall. However, in this case, apparatuses should be set and operated in the hall. In addition, the hall may not be available on the desired date and time. Moreover, in this case, know-how is required for setting microphones. In addition, to lower dirk noise, an air-conditioner and so forth should be stopped.

OBJECTS AND SUMMARY OF THE INVENTION

Therefore, an object of the present invention is to provide an impulse response collecting method that allows reverberation to be recorded in high quality with a small scale of hardware, a sound effect adding apparatus corresponding to the impulse response collecting method, and a record medium on which a program that causes a computer to perform the impulse response collecting method has been recorded.

Therefore, an object of the present invention is to provide an impulse response collecting method, a sound effect adding apparatus, and a record medium that allow a high quality reverberation corresponding to the surround system to be easily obtained.

A first aspect of the present invention is a method for collecting an impulse response used for a convolution calculation process and generating a sound effect, comprising the steps of:

measuring the vibration of a mechanical vibrator corresponding to an applied measurement signal; and converting the measured vibration into an impulse response.

A fourth aspect of the present invention is a method for collecting an impulse response used for a convolution calculation process and generating a sound effect, comprising the steps of:

measuring a space sound generated corresponding to a measurement signal; and converting the measured sound into an impulse response.

A seventh aspect of the present invention is a record medium from which a computer reads impulse response data obtained by a method comprising the steps of:

measuring the vibration of a mechanical vibrator corresponding to an applied measurement signal; and converting the measured vibration into an impulse response.

A ninth aspect of the present invention is a record medium from which a computer reads impulse response data obtained by a method comprising the steps of:

measuring a space sound generated corresponding to a measurement signal; and converting the measured sound into an impulse response.

A eleventh aspect of the present invention is a sound effect adding apparatus for performing a convolution calculation process for impulse response data against an input digital audio signal and thereby adding a sound effect to the digital audio signal, comprising:

reproducing means for reproducing the impulse response data from a record medium on which the impulse response data has been recorded;

inputting means for inputting the digital audio signal; and convolution calculation means for performing a convolution calculation process for the digital audio signal that is input by said inputting means with the impulse response data reproduced by said reproducing means.

A twelfth aspect of the present invention is a method for colleting an impulse response used for a convolution calculation process and generating a sound effect, comprising the steps of:

measuring a space sound generated corresponding to a measurement signal with each of at least four measuring means spatially disposed; and converting each of the measured sounds into impulse responses.

A fifteenth aspect of the present invention is a method for colleting an impulse response used for a convolution calculation process and generating a sound effect, comprising the steps of:

measuring space sounds generated corresponding to a measurement signal at two positions corresponding to a stero system with each of at least two measuring means spatially disposed; and converting each of the measured sounds into impulse responses.

A eighteenth aspect of the present invention is a record medium from which a computer reads impulse response data obtained by a method comprising the steps of:

measuring a space sound generated corresponding to a measurement signal with each of at least four measuring means spatially disposed; and converting each of the measured sounds into impulse responses.

A twentieth aspect of the present invention is a record medium from which a computer reads impulse response data obtained by a method comprising the steps of:

measuring space sounds generated corresponding to a measurement signal at two positions corresponding to a stereo system with each of at least two measuring means spatially disposed; and converting each of the measured sounds into impulse responses.

A twenty second of the present invention is a sound effect adding apparatus for performing a convolution calculation process for impulse response data against an input digital audio signal and thereby adding a sound effect to the digital audio signal, comprising:

reproducing means for reproducing data of a plurality of impulse responses from a record medium on which the data of the plurality of impulse responses has been recorded;

inputting means for inputting the digital audio signal; and a plurality of convolution calculation means for performing a convolution calculation process for the digital audio signal that is input by said inputting means with the data of the plurality of the impulse responses reproduced by said reproducing means.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

Next, with reference to the accompanying drawings, the embodiment of the present invention will be described. An embodiment of the present invention is a sound effect adding apparatus that is a reverberator that adds reverberation to original sound composed of an input digital audio signal. The reverberator performs a convolution calculation process for an input digital audio signal with impulse response data as reverberation collected in a real hall so as to obtain reverberation to be added to the input digital audio signal.

Figure 1:
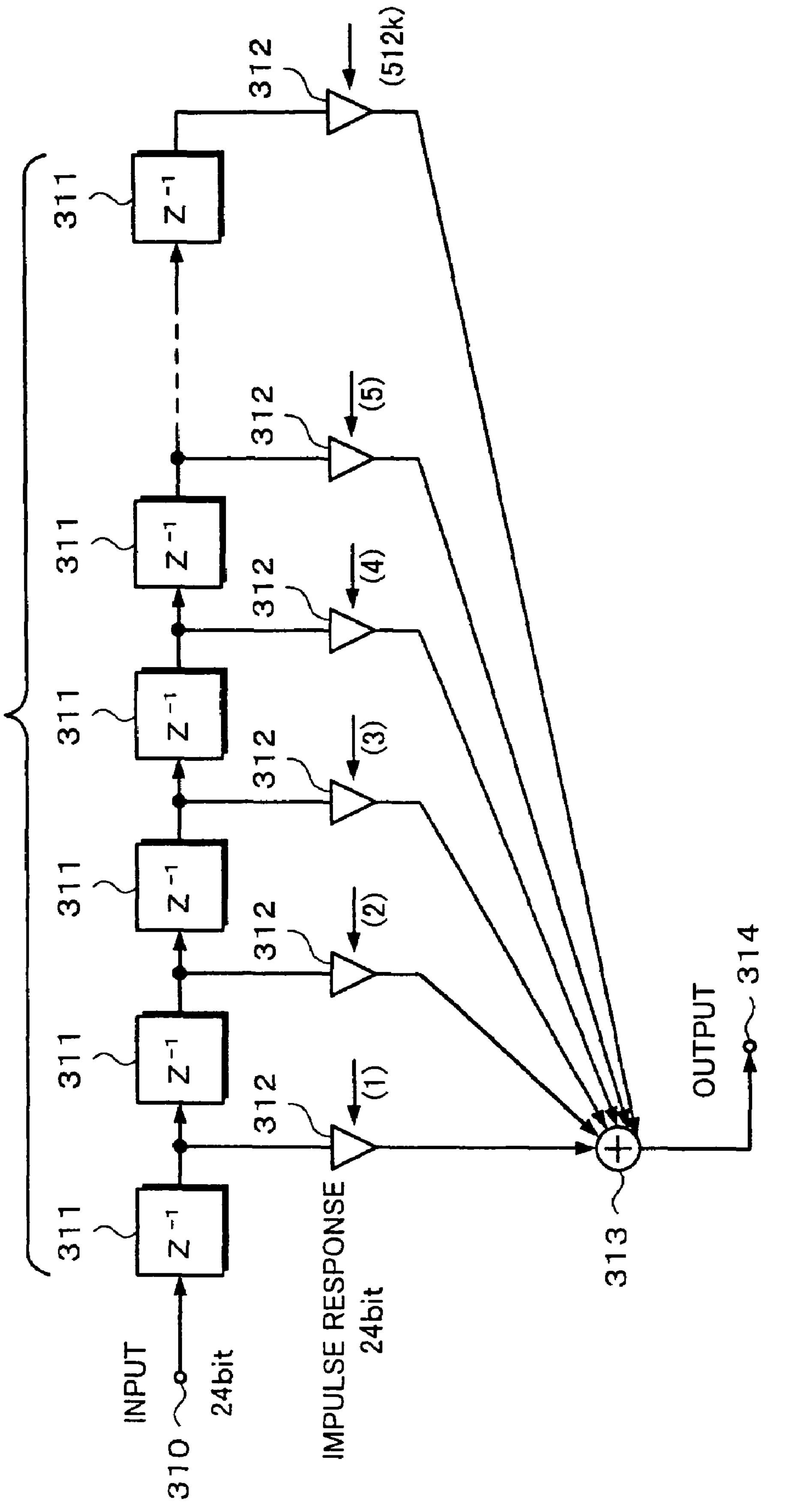
FIG. 1 is a block diagram showing an example of the structure that performs a convolution calculation process for an impulse response in time axis direction using an FIR filter.
Figure 2:
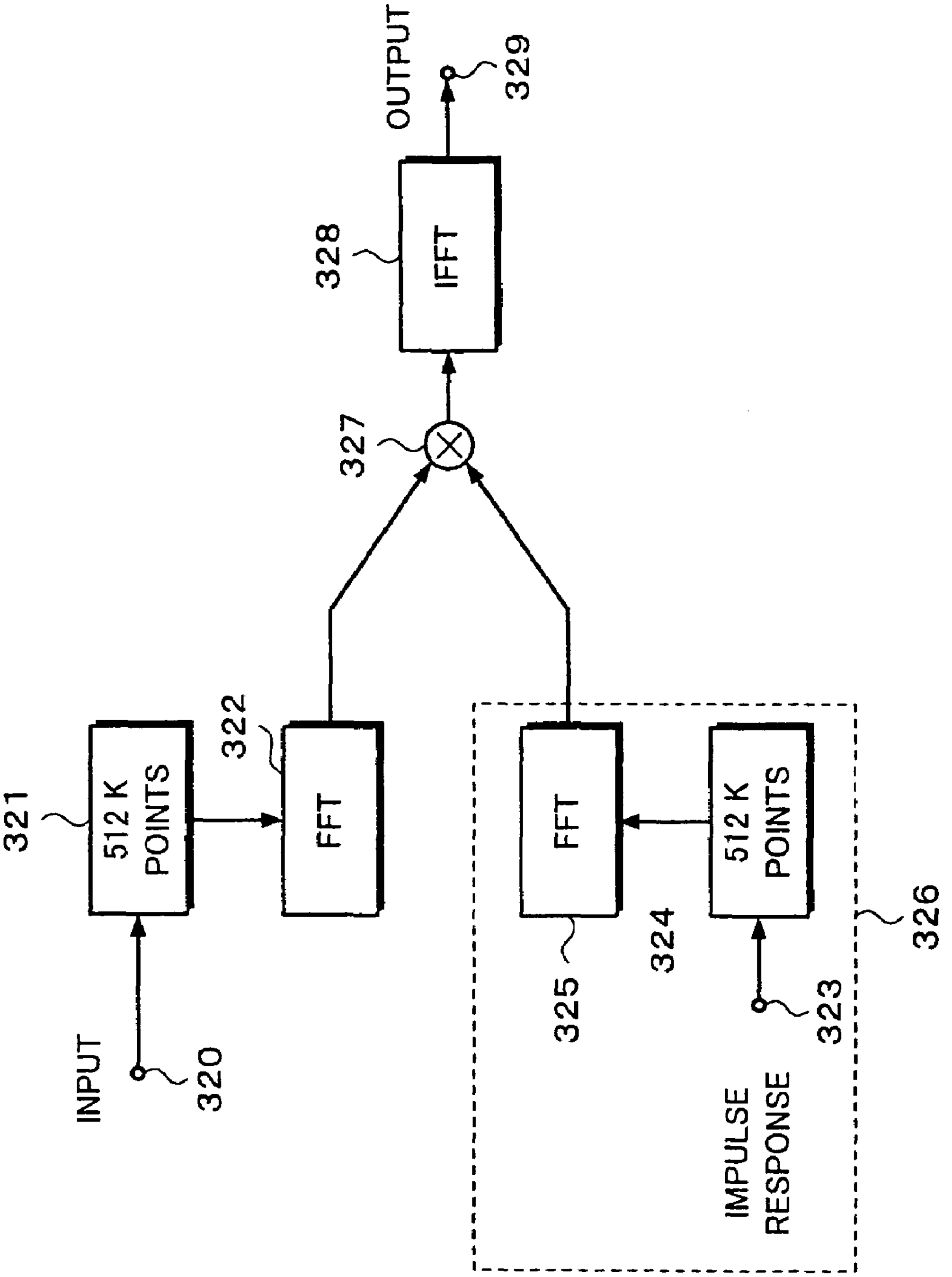
FIG. 2 is a block diagram showing an example of the structure that performs Fourrier transform for an input signal and impulse response data so as to convert them into frequency element data.
Figure 3A:
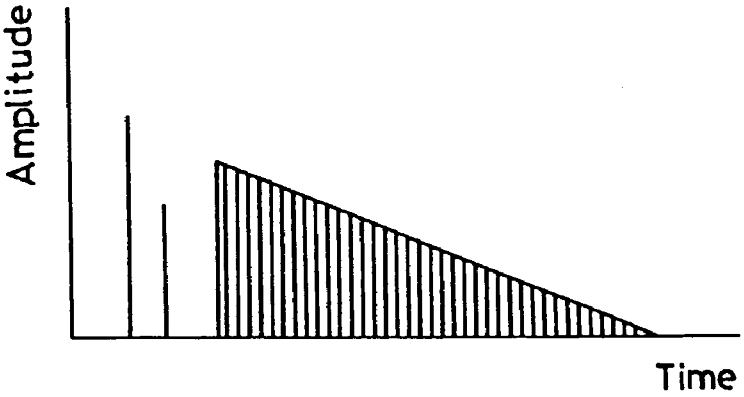
FIG. 3 is a block diagram showing an example of the structure that performs a convolution calculation process for an impulse response in time axis direction using an FIR filter.
Figure 3B:
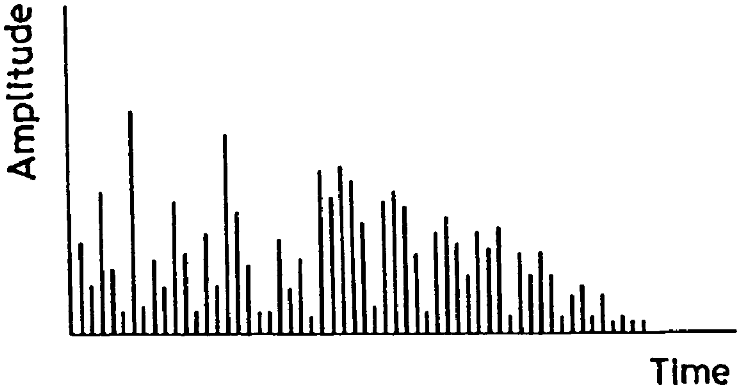

FIGS. 3A and 3B show the relation between reverberation according to the invention and reverberation of a conventional recursive filter. FIG. 3A shows reverberation of the conventional recursive filter. The reverberation shown in FIG. 3A is generated in the following manner. Direct sound is delayed by a predetermined time period and thereby initial reflection sound is generated. The initial reflection sound is further delayed by a predetermined time period. Reverberation generated by the filter is added. The generated reverberation attenuates corresponding to a simple attenuation curve. In contrast, according to the embodiment of the present invention, since reverberation is generated with an impulse response corresponding to really recorded data, the reverberation corresponds to acoustic characteristics of a real hall or the like (namely, it does not correspond to a simple attenuation curve). Thus, according to the embodiment of the present invention, as mentioned in FIG. 3B, more natural and high quality reverberation can be obtained.

Figure 4:
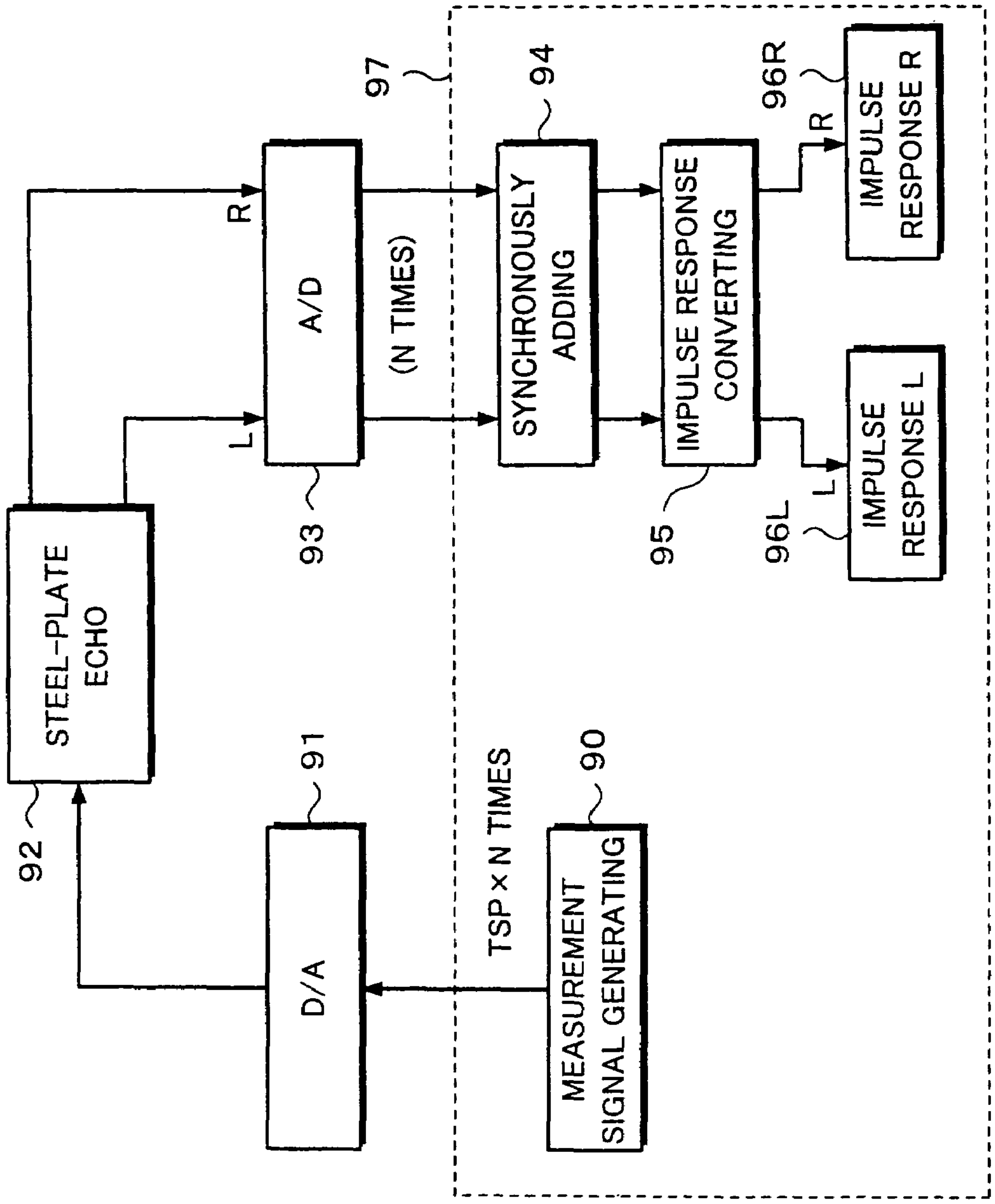
FIG. 4 is a block diagram showing an example of the structure that performs Fourrier transform for an input signal and impulse response data so as to convert them into frequency element data.

According to the present invention, an impulse response collecting method for obtaining natural reverberation is accomplished. FIG. 4 shows an example of the structure of an impulse response collecting apparatus 97 according to the present invention. In this example, the impulse response collecting apparatus 97 measures an impulse response of a steel-plate echo apparatus 92. The impulse response collecting apparatus 97 can be composed of for example a personal computer. The apparatus 97 generates a signal for measuring an impulse response and outputs the signal to a measurement object. In addition, the apparatus 97 collects measured results and converts them into impulse response data. The impulse response data is stored as for example a file.

A measurement signal generating portion 90 generates a TSP (Time Stretch Pulse) signal for measuring an impulse response. The TSP signal is a kind of a sweep signal. When generating impulse signal is convulated by an inverse function to TSP signal, an impulse signal is obtained. To measure the impulse response, it is preferred to directly generate the impulse signal. However, it is difficult to measure the impulse signal directly generated. Thus, generating impluse signal is convoluted by inverse function to TSP signal, the TSP signal generated by the measurement signal generating portion 90 is supplied to a D/A converter 91. The D/A converter 91 converts the TSP signal as a digital signal into an analog signal. The resultant analog signal is supplied to a steel-plate echo apparatus 92.

The steel-plate echo apparatus 92 generates reverberation with the input TSP signal. The reverberation is output as analog audio signals on left (L) and right (R) channels. The analog audio signals on L and R channels are supplied to an A/D converter 93. The A/D converter 93 converts the analog audio signals on L and R channels into respective digital audio signals. The A/D converter 93 samples the digital audio signals at a sampling frequency of 48 kHz or 96 kHz with 24 quantizing bits. Output signals on L and R channels of the A/D converter 93 are supplied to an impulse response collecting apparatus 97. The input signals of the impulse response collecting apparatus 97 are stored to a hard disk unit or a memory (not shown).

The measurement signal generating portion 90 generates the TSP signal N times. A synchronously adding portion 94 synchronously adds N output signals of the measurement signal generating portion 90. The synchronously adding process is performed in such a manner that the output signals of the synchronously adding portion 94 are synchronized corresponding to the generation timing of the TSP signal. By synchronously adding N signals, only reproducible signals are added. Thus, since noise components that generate at random are not added, the S/N ration of the resultant signal can be improved. In other words, the S/N ratio of the resultant signal is improved by (10 log N) dB. For example, with N=16, the S/N ratio of the result at signal is improved by 12 dB.

The synchronously added signals on L and R channels are supplied to an impulse response converting portion 95. In the impulse response converting portion 95, a convolution calculation with the TSP signal is performed to a supplied digital audio signal. Thus, the TSP signal is converted into an impulse signal. The measured result is converted into an impulse response corresponding to reverberation generated with the impulse signal. The impulse response data has peak values obtained at intervals corresponding to the sampling frequency. After the AID converter 93 samples a signal with 24 quantizing bits, the number of quantizing bits becomes 32.

Impulse response data 96L on L channel and impulse response data 96R on R channel that are supplied from the impulse response converting portion 95 are stored to a predetermined record medium such as a CD-ROM or an MD. Alternatively, the impulse response collecting apparatus 97 may be provided with an interface such as Ethernet so as to supply the impulse response data to an external apparatus.

Figure 5:
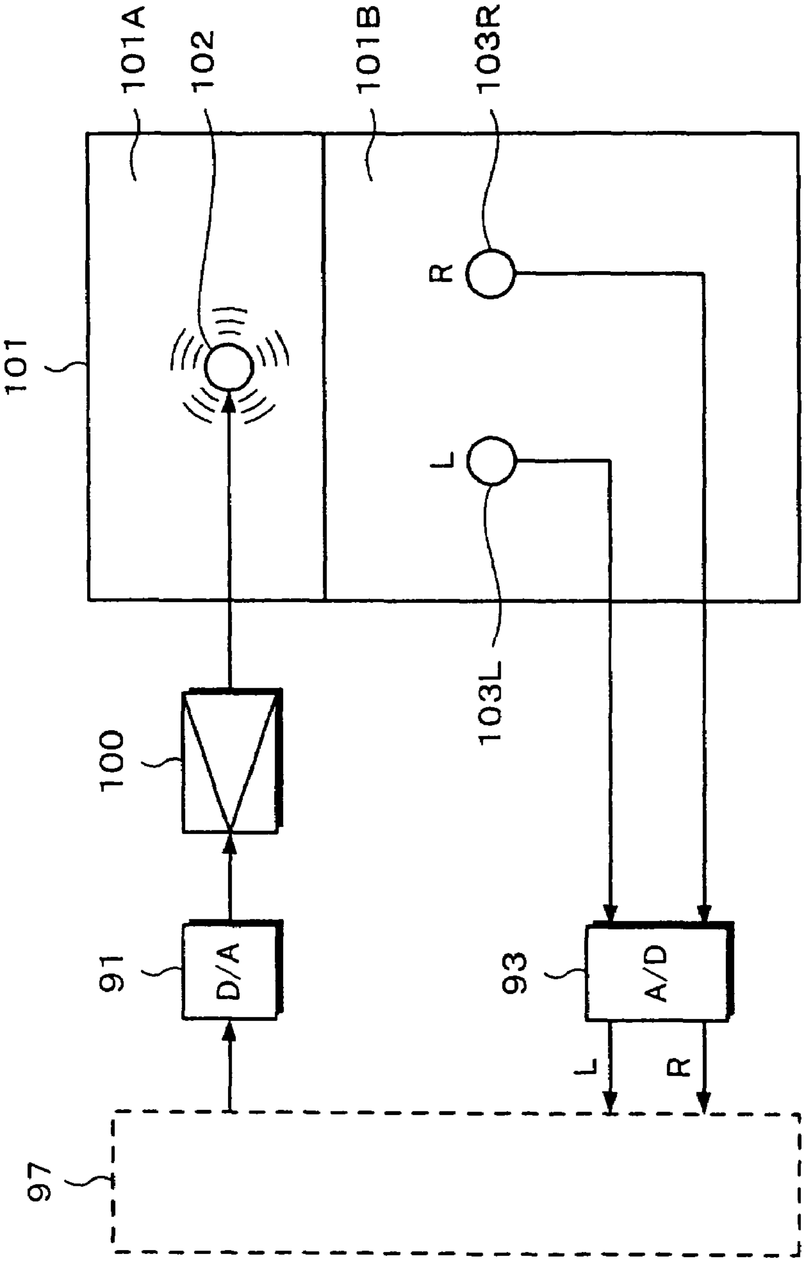
FIGS. 5A and 5B are schematic diagrams showing the relation between reverberation according to an embodiment of the present invention and reverberation of a conventional recursive filter.

FIG. 5 shows an example of the case that an impulse response is collected in a hall. Referring to FIG. 5, a hall 101 has a stage portion 101A and a guest seat portion 101B. A sound source 102 is disposed at a particular position of the stage portion 101A. The sound source 102 is a dodecahedron speaker of which 12 speakers are disposed in 12 directions on a sphere. A microphone 103L on L channel and a microphone 103R on R channel are disposed in the guest seat portion 101B.

A TSP signal is supplied from an impulse response collecting apparatus 97 to a D/A converter 91. The D/A converter 91 converts the TSP signal as a digital signal into an analog signal. The analog signal is supplied to an amplifier 100. The amplifier 100 amplifies the analog signal. The amplified signal is supplied to the sound source 102. The sound source 102 reproduces the amplified signal as sound. The reproduced sound is collected by the microphones 103L and 103R. Output signals of the microphones 103L and 103R are supplied to an A/D converter 93. The A/D converter 93 samples the output signals of the microphones 103L and 103R at a predetermined sampling frequency and with a predetermined number of quantizing bits. The resultant signals are supplied as digital audio signals on L and R channels to the impulse response collecting apparatus 97. The process of the impulse response collecting apparatus 97 is the same as the process of the above-described steel-plate echo apparatus 92.

In this example, the position of the sound source 102 is varied and impulse response data corresponding to varied positions is collected. In addition, the brands of speakers used as the sound source 102 are also changed and impulse response data corresponding to the individual brands of the speakers is collected. Likewise, the positions and brands of the microphones 103L and 103R are changed and impulse response data corresponding thereto is collected. In such a manner, a plurality of types of data in the hall 101 are collected. When reverberation is added, one of these types can be selected as variations of reverberation.

Figure 6:
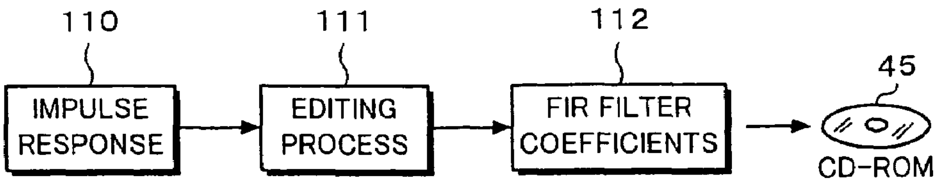
FIG. 6 is a block diagram showing an example of the structure of an impulse response collecting apparatus according to the present invention.
Figure 7A:
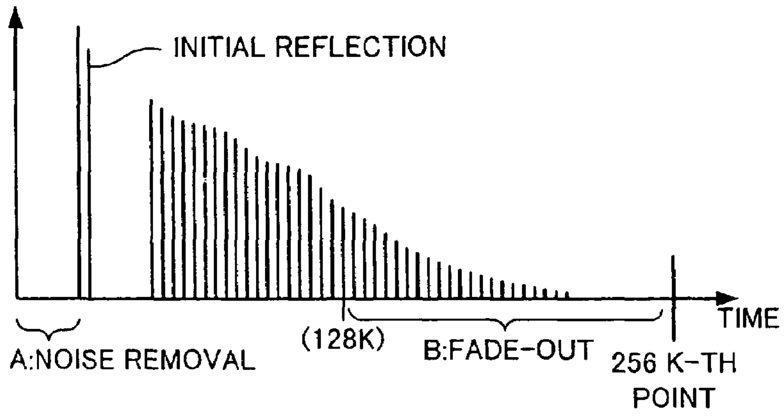
FIGS. 7A to 7C are schematic diagrams showing examples of the case that an impulse response is collected in a hall.
Figure 7B:
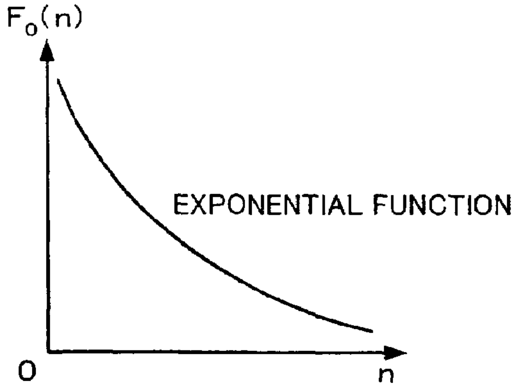
Figure 7C:
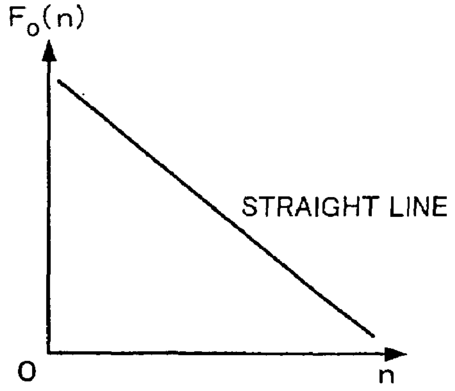

On the other hand, the impulse response data 96L and 96R obtained in the impulse response converting portion 95 can be edited. FIG. 6 shows a flow of an editing process of impulse response data. Referring to FIG. 6, impulse response data 110 is supplied to an editing process portion 111. FIGS. 7A, 7B, and 7C show examples of the editing process 111. As shown in FIG. 7A, a system delay takes place in data due to propagation of sound (a system delay portion is denoted by "A" in FIG. 7A). The editing process portion 111 sets the value of the system delay portion to "0" so as to remove noise therefrom.

At the last half of the data, a fade-out process is performed so as to converge the last end of the data at [0]. With the fade-out process, noise of a low level portion of the second half of the signal is removed. FIGS. 7B and 7C show examples of the fade-out process.

FIG. 7B shows an example of which the fade-out process is performed corresponding to an attenuation exponential function. In FIG. 7B, the original impulse response is denoted by h(n) and the fade-out function is denoted by $F_0(n)$ (where n represents a point of impulse response data). It should be noted that a point of impulse response data corresponds to a sampling point of a digital audio signal. In the case of $n \leqq 0$, the relation of $F_0(n)=1$ is satisfied. In contrast, in the case of $n>0$, $F_0(n)$ represents an attenuation exponential function as shown in FIG. 7B.

Output data x(n) is represented by the following expression (1).

$$x(n)=h(n)\cdot F_0(n-a) \quad (1)$$

where a is the number of samples corresponding to the position of direct sound in the original impulse response. The fade-out process is performed after the position of direct sound. If the fade-out process is performed at the position of the direct sound (namely, n=0), the level of the direct sound also decreases.

It should be noted that the fade-out function is not limited to an attenuation exponential function. For example, as shown in FIG. 7C, the fade-out function may be a function having a linear attenuation characteristic.

The number of points of the impulse response data can be adjusted corresponding to the process capability of the reverberator that adds reverberator to an audio signal with such data of the fade-out process. In the case that the number of points of impulse response data is limited to a predetermined value (for example, 256 k points≈262, 144 points), as shown in FIG. 7A, at the 128 k-th point, the fade-out process is started and at the 256 k-th point, the data becomes [0].

As an example of the editing process 111, a level adjusting process may be performed. The edited impulse response data is recorded as an FIR filter coefficient 112 for a convolution calculation process of the FIR filter to for example a CD-ROM 45.

Figure 8:
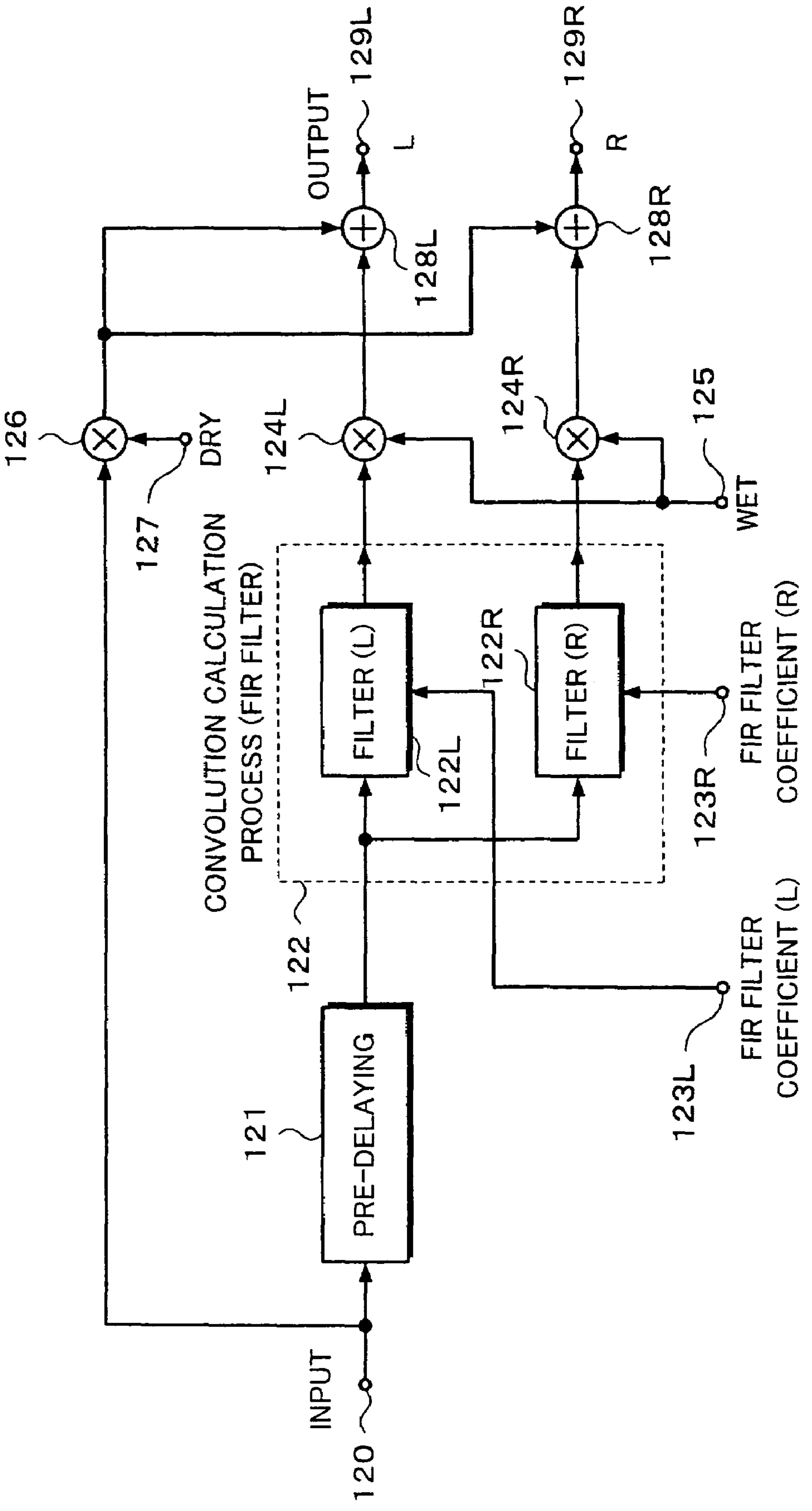
FIG. 8 is a block diagram showing an example of an editing process for an impulse response.

FIG. 8 shows an example of the structure of a reverberator that performs a convolution calculation process with impulse response data generated in the above-described manner. Referring to FIG. 8, a digital audio signal is input from an input terminal 120. The input signal is supplied to a multiplying device 126. In addition, the input signal is supplied to a pre-delaying portion 121. The pre-delaying portion 121 delays the input data. Output data of the pre-delaying portion 121 is supplied to a convolution calculation process portion 122.

The convolution calculation process portion 122 is composed of FIR filters on L and R channels (namely, a filter 122L and a filter 122R). The impulse response data 96L and 96R generated by the impulse response collecting apparatus 97 are supplied as FIR filter coefficients on L and R channels from terminals 123L and 123R, respectively. The impulse response data 96L and 96R are read from for example a CD-ROM (not shown).

The filters 122L and 122R perform convolution calculation processes for the input digital audio signals with the impulse response data 96L and 96R, respectively. Thus, reverberation corresponding to the impulse response data 96L and 96R is generated. Output signals of the filters 122L and 122R are supplied to multiplying devices 124L and 124R, respectively.

The multiplying devices 124L and 124R, the above-described multiplying devices 126, and the adding devices 128L and 128R compose a mixer of the original sound (a dry component) and reverberation (a wet component). Corresponding to the ratio of the original sound and reverberation supplied to the terminals 127 and 125, the multiplying device 126 and the-multiplying devices 124L and 124R adjust the input digital audio signal and the output signal of the convolution calculation process portion 122. The adding devices 128L and 128R add these signals. Thus, the output signal on L channel and the output signal on R channel are supplied to output terminals 129L and 129R, respectively.

Figure 9:
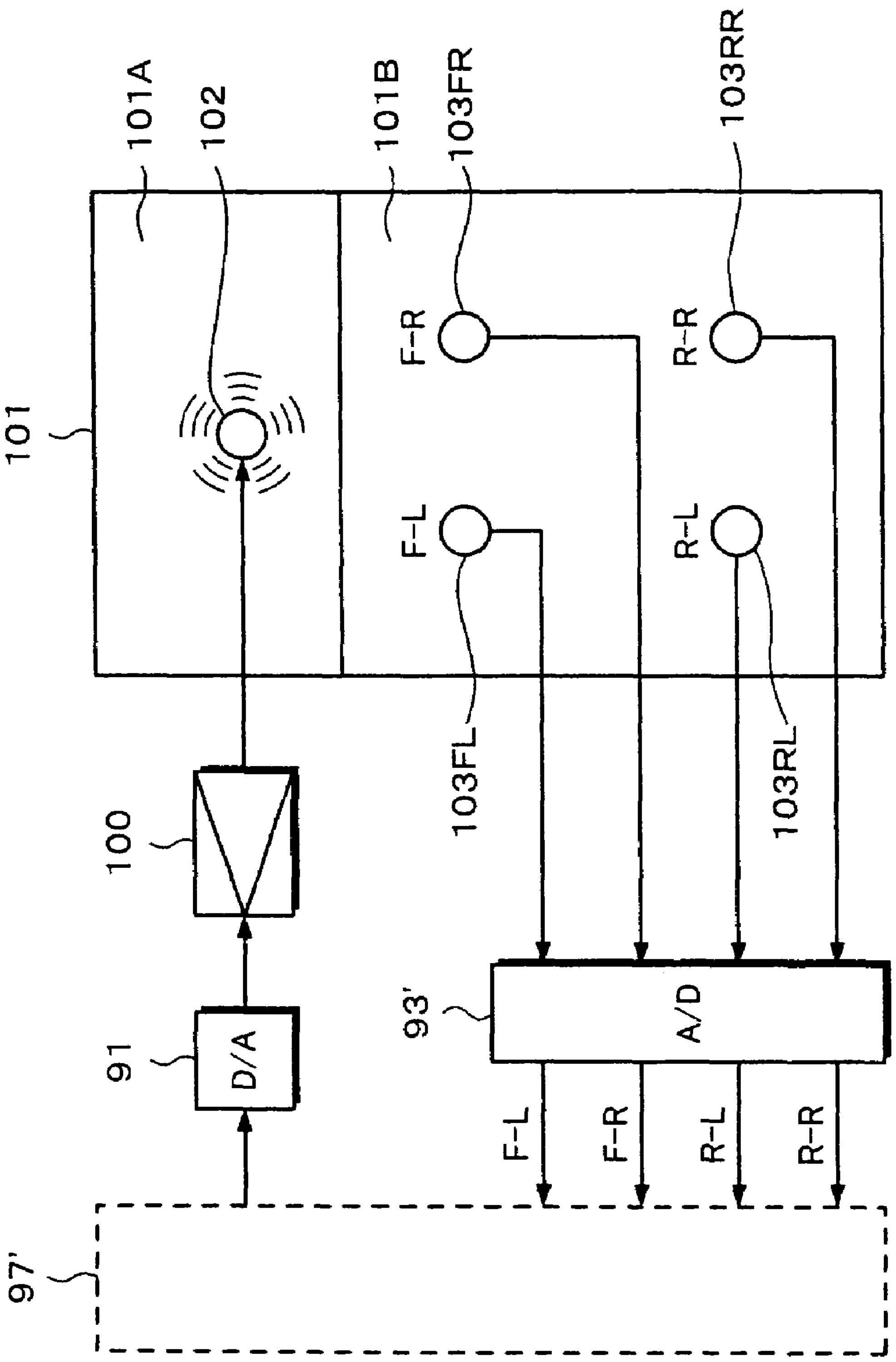
FIG. 9 is a schematic diagram showing an example of a system that collects impulse response data corresponding to surround system.

Next, according to the second aspect of the present invention, an impulse response collecting method corresponding to the surround system will be described. FIG. 9 shows an example of the impulse response collecting method corresponding to the surround system. As with the above-described method, impulse response data is collected in a hall 101 that has a stage portion 101A and a guest seat portion 101B. A sound source 102 composed of for example a dodecahedron speaker is disposed at a predetermined position of the stage portion 101A.

In the guest seat portion 101B, four microphones 103FL, 103FR, 103RL, and 103RR are disposed at predetermined positions corresponding to the surround system. The microphones 103FL and 103FR correspond to a front left channel (F-L channel) and a front right channel (F-R channel) of the guest seat portion 101B, respectively. The microphones 103RL and 103RR correspond to a rear left channel (R-L channel) and a rear right channel (R-R) channel of the guest seat portion 101B, respectively.

For example, the microphones 103FL, 103FR, 103RL, and 103RR are disposed so that a listener present at an optimum position against the stage portion 101A can have a sufficient surround effect.

Output signals of the microphones 103FL, 103FR, 103RL, and 103RR are supplied to an A/D converter 93'. The A/D converter 93' is a four-channel system as a modification of the above-described A/D converter 93. In other words, the A/D converter 93' processes signals of four channels. The A/D converter 93' samples input signals of F-L (front left) channel, F-R (front right) channel, R-L (rear left) channel, and R-R (rear right) channel at a predetermined sampling frequency and with a predetermined number of quantizing bits and supplies the resultant digital audio signals to an impulse response collecting apparatus 97'.

As described above, the impulse response collecting apparatus 97' is an extended apparatus of the above-described impulse response collecting apparatus 97 so as to process signals of four channels. The impulse response collecting apparatus 97' performs the same process as the above-described steel-plate echo apparatus 92 for the four channels F-L, F-R, R-L, and R-R. Thus, the impulse response collecting apparatus 97' obtains four-channel impulse response data 96F-L, 96F-R, 96R-L, and 96R-R (not shown).

In this case, as with the above-described embodiment, by varying the position of the sound source 102, impulse response data is collected. In addition, by using various types of speakers as the sound source 102, impulse response data is collected. Likewise, by using various types of microphones as the four microphones 103FL, 103FR, 103RL, and 103RR and by changing the positions thereof, impulse response data is collected. In such a manner, a plurality of types of impulse response data are collected in the hall 101. The collected impulse response data can be selected as a variation of reverberations when a reverberation is added to an original audio sound.

In this case, as with the above-described embodiment, impulse response data can be edited. The edited impulse response data is recorded to a CD-ROM 45.

Figure 10:
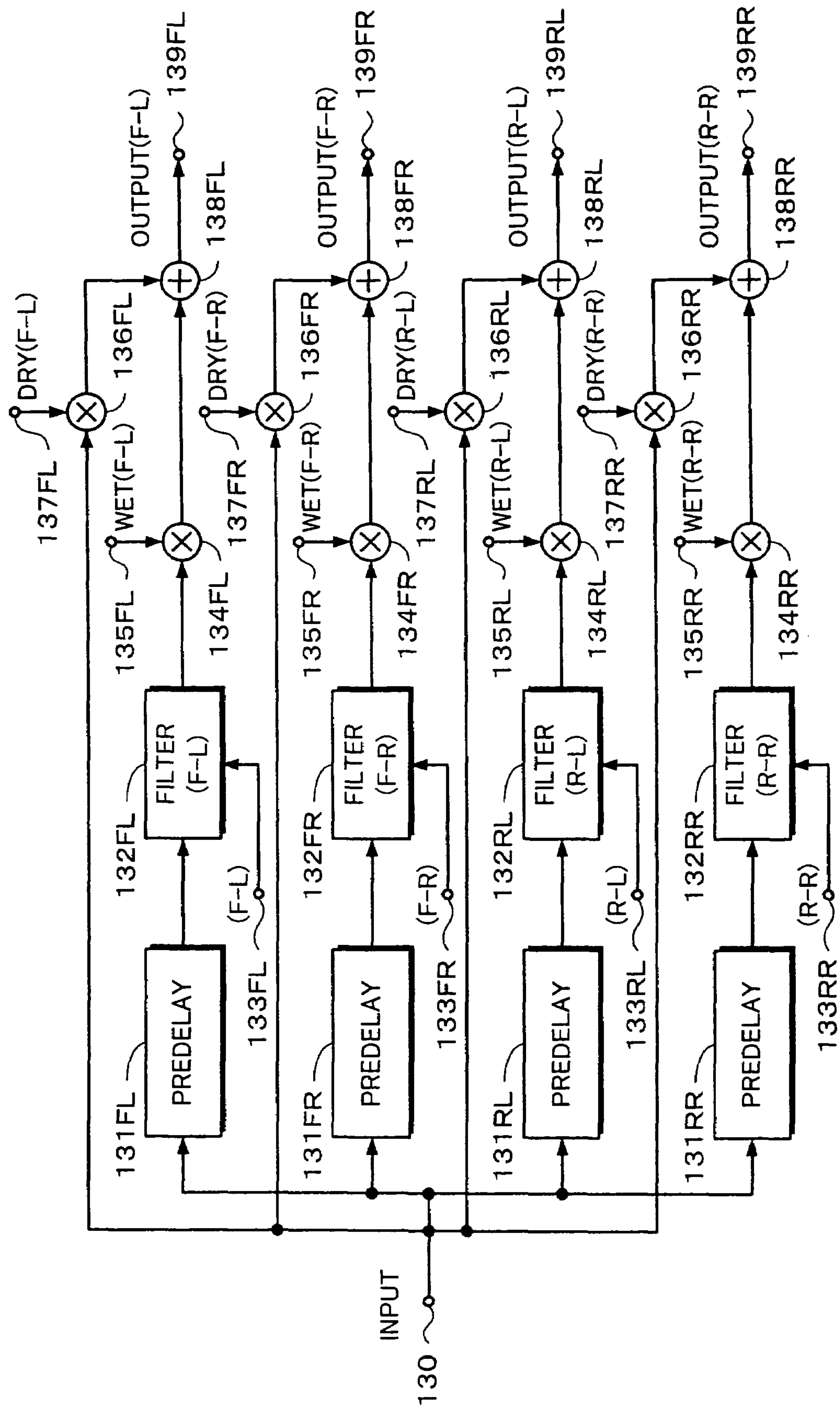
FIG. 10 is a block diagram showing an example of the structure of a reverberation adding apparatus that adds reverberations to input data corresponding to surround system.

FIG. 10 shows an example of the structure of a reverberation adding apparatus that adds a reverberation corresponding to the surround system to input data corresponding to impulse response data collected in the method shown in FIG. 9. An original digital audio signal is input from an input terminal 130. The input data is supplied to multiplying devices 136FL, 136FR, 136RL, and 136RR and pre-delay devices 131FL, 131FR, 131RL, and 131RR. The multiplying devices 136FL, 136FR, 136RL, and 136RR output dry components of F-L, F-R, R-L, and R-R channels. The pre-delay devices 136FL, 136FR, 136RL, and 136RR output wet components of F-L, F-R, R-L, and R-R channels.

In this example, the same process is performed independently for each of the F-L, F-R, R-L, and R-R channels. Next, for simplicity, the process for only the F-L-channel will be described. Input data of the F-L channel is supplied to the pre-delay device 131FL. The pre-delay device 131FL delays the data of the F-L channel. Output data of the pre-delay device 131FL is supplied to an FIR filter 132FL that performs a convolution calculation process for impulse response data.

Impulse response data 96F of the F-L channel as a filter coefficient is supplied from the impulse response collecting apparatus 97' to the FIR filter 132FL through a terminal 133FL. The impulse response data 96F-L is read from for example the CD-ROM 45 (not shown).

The FIR filter 132F-L performs a convolution calculation process for a digital audio signal with the impulse response data 96F-L. Thus, a reverberation corresponding to the impulse response data 96F-L is generated. An output signal of the FIR filter 132F-L is supplied to the multiplying device 134.

The multiplying device 134FL, the multiplying device 136FL, and an adding device 138FL compose a mixer of an original sound (dry component) and a reverberation of the F-L channel. Corresponding to the ratio of the original sound and reverberation received from the terminals 137 and 135, the multiplying devices 136FL and 134FL adjust the input digital audio signal that is directly received from the input terminal 130 and the output signal of the FIR filter FL132, respectively. The adding device 138FL adds these signals. An output signal of the adding device 138FL is supplied as an output signal of the F-L channel to an output terminal 139FL.

As with the process for the F-L channel, the same process is performed independently for the other three channels. For example, input data of the F-R channel is supplied to the filter 132FR. The filter 132FR performs a convolution calculation process for the input data of the F-R channel with the impulse response data 96FR of the relevant channel. A mixer composed of the multiplying device 137FR, the multiplying device 136FR, and an adding device 138FR adjusts the ratio of the dry component and the wet component and supplies the resultant data as an output signal of the F-R channel to an output terminal 139FR.

In this example, the same process is performed independently for each of the F-L, F-R, R-L, and R-R channels. Next, for simplicity, the process for only the F-L channel will be described. Input data of the F-L channel is supplied to the pre-delay device 131FL. The pre-delay device 131FL delays the data of the F-L channel. Output data of the pre-delay device 131FL is supplied to an FIR filter 132FL that performs a convolution calculation process for impulse response data.

Figure 11:
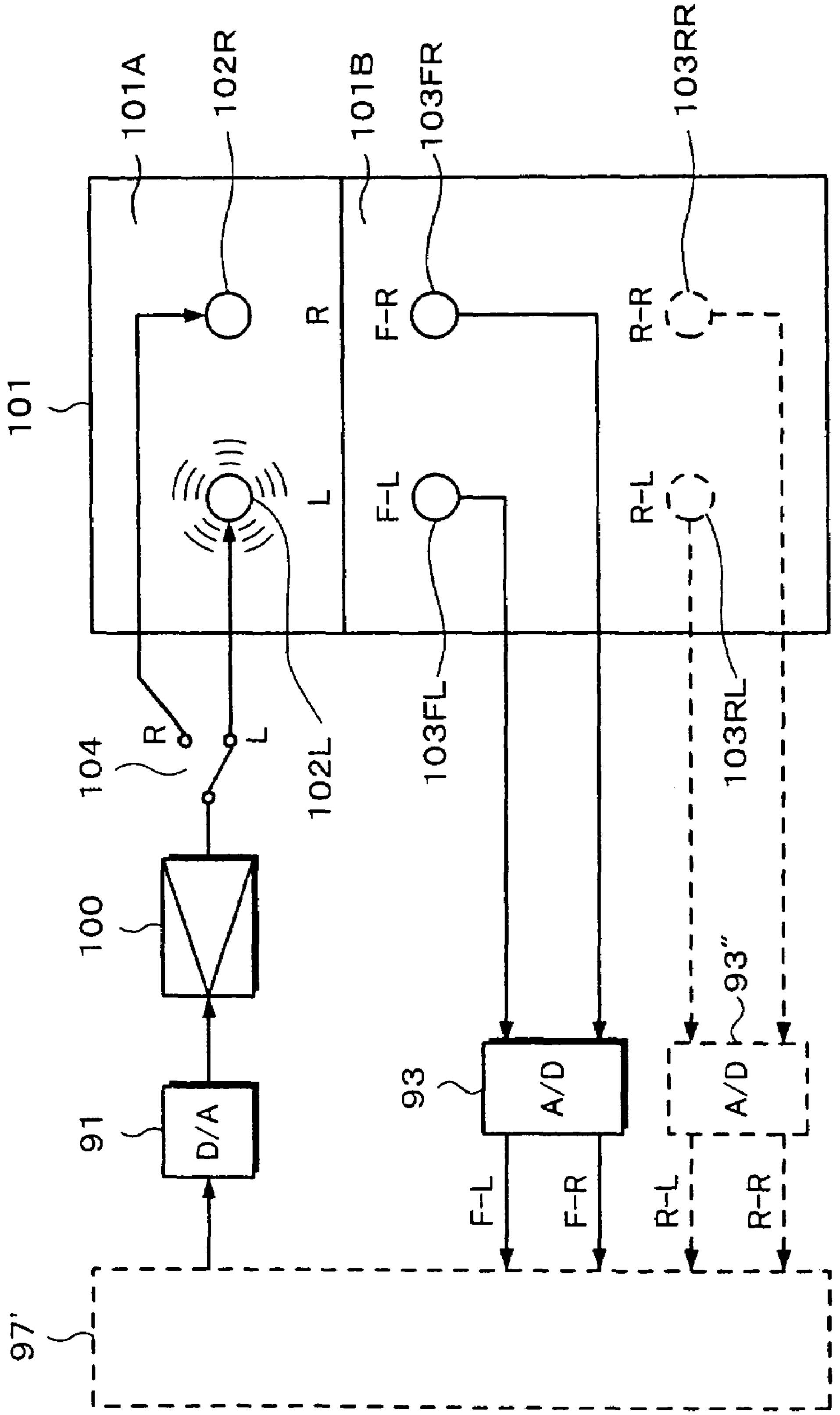
FIG. 11 is a schematic diagram showing an example of a system that collects impulse response data corresponding to stereo input data.

FIG. 11 shows an example in the case that impulse response data is collected corresponding to stereo input signals. In this case, sound sources 102L and 102R that are dodecahedron speakers disposed in a stage portion 101A. The sound source 102L is disposed at a predetermined position on the left of a guest seat portion 101B. The sound source 102R is disposed at a predetermined position on the right of the guest seat portion 101B. As with the example shown in FIG. 4, two microphones 103F-L and 103F-R of the L and R channels are disposed at predetermined positions.

A TSP signal is supplied from an amplifier 100 to one of the sound sources 102L and 102R selected by a selecting portion 104. The selecting portion 104 may be a switch. Alternatively, as the selecting portion 104, a cable of a desired sound source of the sound sources 102L and 102R may be directly connected to the amplifier 100.

Impulse response data is collected on the L and R channels one after the other. The selecting portion 104 selects for example the sound source 102L. The sound source 102L reproduces the TSP signal. With the microphones 103F-L and 103F-R, the reproduced sound of the TSP signal is recorded. Output signals of the microphones 103F-L and 103F-R are supplied to an impulse response collecting apparatus 97 through an A/D converter 93. The impulse response collecting apparatus 97 performs an impulse response converting process and obtains impulse response data 96L/F-L of the L channel and impulse response data 96L/F-R of the R channel for the sound source 102R of the L channel.

Likewise, impulse response data is collected from the sound source 102R. Thus, the TSP signal reproduced by the sound source 102R is recorded with the microphones 103F-L and 103F-R. The impulse response collecting apparatus 97 obtains impulse response data 96R/F-L of the L channel and impulse response data 96R/F-R of the R channel for the sound source 102R of the R channel.

The impulse response data 96L/F-L, 96L/F-R, 96R/F-L, and 96R/F-R are edited in a predetermined manner and then recorded to a CD-ROM 45.

Figure 12:
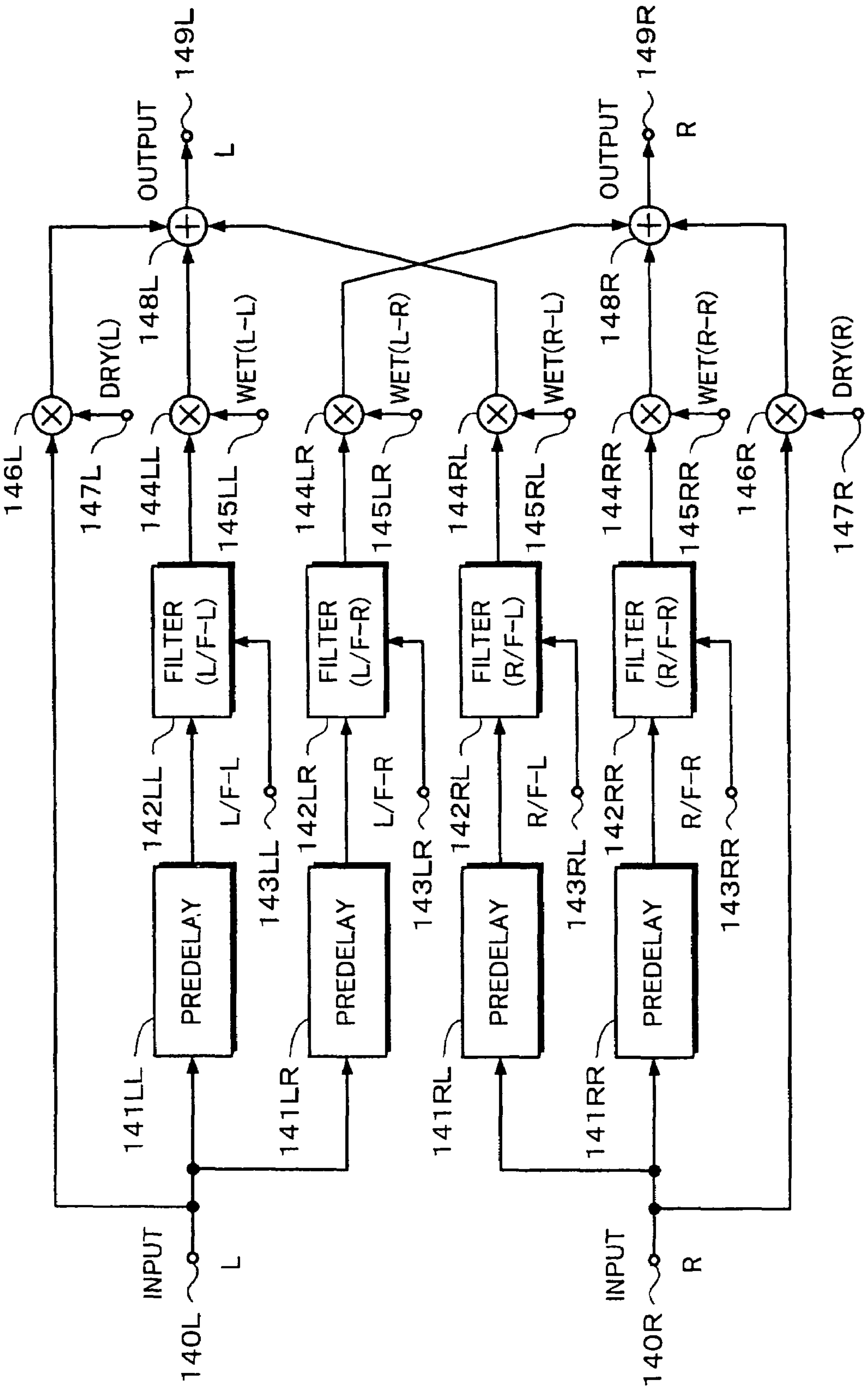
FIG. 12 is a block diagram showing an example of the structure of a reverberation adding apparatus that adds reverberations to input data corresponding to inputted data.

FIG. 12 shows an example of the structure of a reverberation adding apparatus that adds stereo reverberations to stereo input data corresponding to impulse response data collected in the method shown in FIG. 11. First of all, input data of the L channel is supplied from an input terminal 140L. In addition, input data of the R channel is supplied from an input terminal 140R.

First of all, the process for the L channel will be described. The input data supplied from the input terminal 140L is supplied to a multiplying device 146L that adjusts the ratio of a dry component. In addition, the input data is supplied to pre-delay devices 141LL and 141LR. The pre-delay devices 141LL and 141LR independently delay the respective input data. Output signals of the pre-delay devices 141LL and 141LR are supplied to filters 142LL and 142LR that preform a convolution calculation process for the impulse response data.

The filter 142LL performs a convolution calculation process for data received from the pre-delay device 141LL with impulse response data 96L/F-L received from a terminal 143LL. An output signal of the filter 142LL is supplied to a multiplying device 144LL that adjusts the ratio of a wet component.

Likewise, the filter 142LR performs a convolution calculation process for the output signal of the pre-delay device 141LR with the impulse response data L/F-R received from a terminal 143LR. An output signal of the filter 142LR is supplied to a multiplying device 144LR that adjusts the ratio of a wet component.

Next, the process for the R channel will be described. Input data received from an input terminal 140R is supplied to a multiplying device 146R that adjusts the ratio of a dry component. In addition, the input data is supplied to pre-delay devices 141RL and 141RR. The pre-delay devices 141RL and 141RR independently delay the respective input data. Output signals of the pre-delay devices 141RL and 141RR are supplied to filters 142RL and 142RR that perform a convolution calculation process for the input data with impulse response data, respectively.

The filter 142RL performs a convolution calculation process for data received from the pre-delay device 141RL with impulse response data 96R/F-L received from a terminal 143RL. Output data of the filter 142RL is supplied to a multiplying device 144RL that adjusts the ratio of a wet component.

Likewise, the filter 142RR performs a convolution calculation process for the output data of the pre-delay device 141RR with the impulse response data R/F-R received from a terminal 143RR. Output data of the filter 142RR is supplied to a multiplying device 144RR that adjusts the ratio of a wet component.

The multiplying devices 144LL, 144LR, and 146L adjust the ratio of a dry component and a wet component of the input data of the L channel. The ratio of the dry component of the data of the L channel is supplied from a terminal 147L to the multiplying device 146L. In addition, the ratio of the wet component is supplied from terminals 145LL and 145LR to the multiplying devices 144LL and 144LR, respectively. Output data of the multiplying devices 146L and 144LL is supplied to an adding device 148L. Output data of a multiplying device 144RL is also supplied to the adding device 148L. The adding device 148L adds these three types of output data and supplies the added data as output data of the L channel to an output terminal 149L.

On the other hand, the multiplying devices 144RR, 144RL, and 146R adjust the ratio of the dry component and the wet component of the input data of the R channel. The ratio of the dry component of the input data of the R channel is supplies from a terminal 147R to the multiplying device 146R. The terminals 145RR and 145RL supply the ratio of the wet component to the multiplying devices 144RR and 144RL. Output data of the multiplying devices 146R and 144RR is supplied to an adding device 148R. Output data of the multiplying device 144LR is also supplied to the adding device 148R. The adding device 148R adds these three types of data and supplies the added result as the output data of the R channel to an output terminal 149R.

In the case of stereo input data, reverberations of the L channel and the R channel of the sound sources 102L and 102R are added to the input data of the L and R channels, respectively. When data is output, reverberations are mixed on each channel. A convolution calculation process for input data of the L channel and R channel is performed with impulse response data collected in stereo so as to add reverberations to input stereo data. Thus, natural stereo sounds are obtained.

As denoted by dotted lines of FIG. 11, two more microphones 103R-L and 103R-R may be disposed on the rear side. In this case, in addition to the stereo system, a measurement corresponding to the surround system can be performed. In this method, the four microphones 103F-L, 103F-R, 103R-L, and 103R-R collect impulse response data with sound sources of the L and R channels. Thus, a total of eight types of impulse response data can be obtained. Thus, when data is reproduced, two sets of the structure shown in FIG. 12 are required. Likewise, a center microphone (not shown) may be disposed between the microphones 103F-L and 103F-R.

Figure 13:
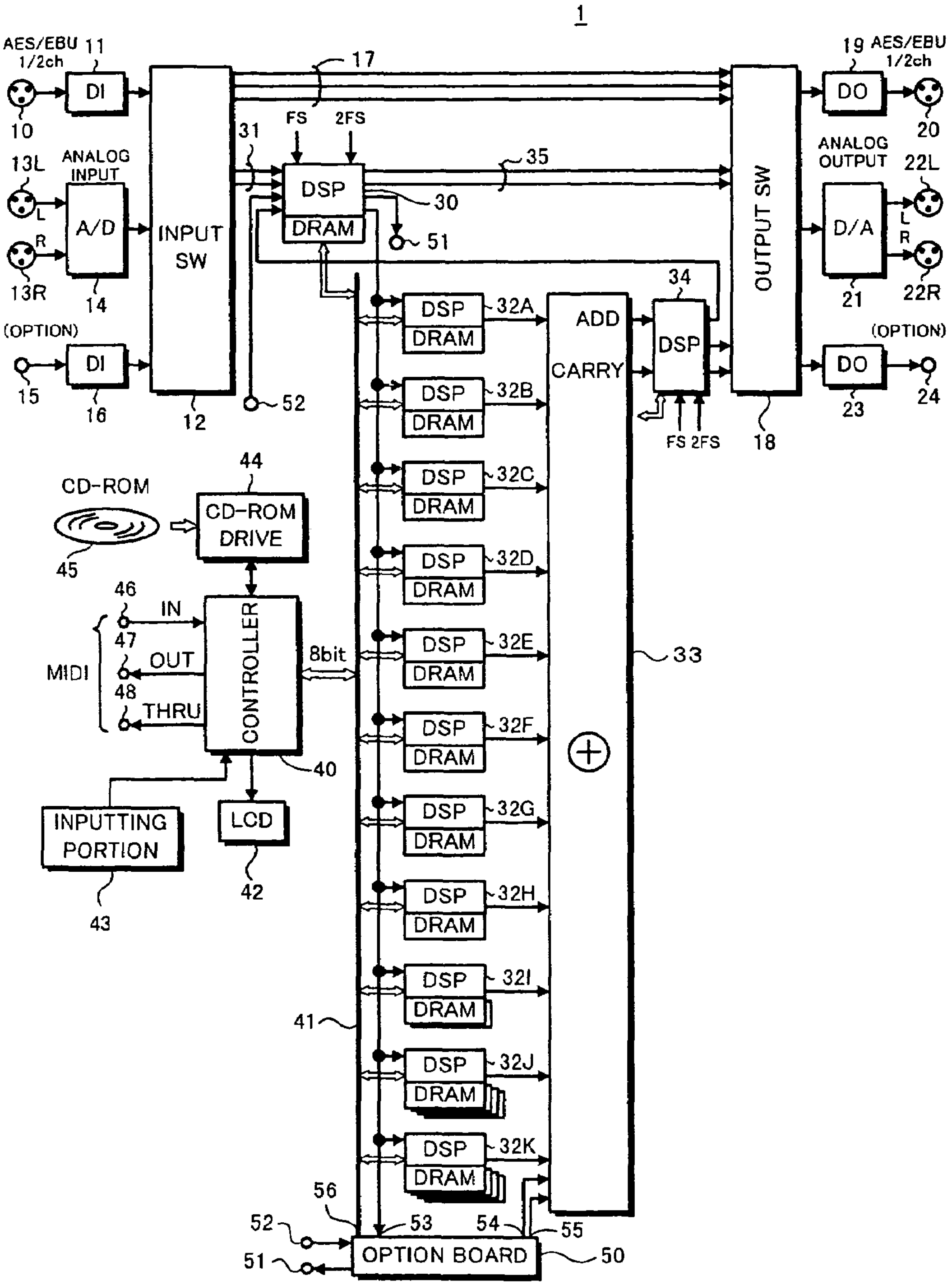
FIG. 13 is a block diagram showing a practical example of the structure of the reverberator.

FIG. 13 shows a detailed example of the structure of the reverberator. In the reverberator 1, digital audio signals of two channels (channel 1 and channel 2) are input from a digital audio input terminal 10 corresponding to AES/EBU (Audio Engineering Society/European Broadcasting Union) standard. The digital audio signals received from the input terminal 10 are supplied to an input switcher 12 through a digital inputting portion 11.

In this example, the sampling frequency and the number of quantizing bits of the input digital audio signals are 48 kHz and 24 bits, respectively. When an option board 50 (that will be described later) is connected to the reverberator 1, the sampling frequency of digital audio signals handled by the reverberator 1 can be doubled (namely, 96 kHz). In addition, digital audio signals at a sampling frequency of 44.1 kHz can be handled by the reverberator 1. In this case, when the option board 50 is connected to the reverberator 1, signals at a sampling frequency of 88.2 kHz can be handled by the reverberator 1.

When analog audio signals are input to the reverberator 1, analog audio input terminals 13L and 13R are used. Audio signals on L and R channels are input from the input terminals 13L and 13R, respectively. An A/D converter 14 samples the audio signals at a sampling frequency of for example 48 kHz with 24 quantizing bits so as to convert these signals into respective digital audio signals. Output signals of the A/D converter 14 are supplied to an input switcher 12.

The input switcher 12 switches a source of input audio signals under the control of a controller 40 (that will be described later) or with a manual switch. Output signals of the input switcher 12 are supplied to a DSP (Digital Signal Processor) 30 through a path 31.

The DSP 30 has a DRAM (Dynamic Random Access Memory) and performs various control processes for input/output digital audio signals corresponding to a program received from the controller 40. The DSP 30 supplies input digital audio signals to DSPs 32A to 32K that perform convolution calculation processes for obtaining impulse response data corresponding to a predetermined process. In addition, the DSP 30 generates initial reflection sound corresponding to the input signals. Moreover, the DSP 30 receives the result of the convolution calculation process for the impulse response data from a DSP 34 (that will be described later).

The DSPs 32A to 32K divide input digital audio signals into blocks with predetermined sizes and perform convolution calculation processes for the divided blocks with the pre-supplied impulse response data. The DSPs 32A to 32K have respective DRAMs with relevant capacities corresponding to the number of samples to be processed. In this example, each of the DSPs 32A to 32H has one DRAM. The DSP 32I has two DRAMs. Each of the DSPs 32J and 32K has one DRAM with a capacity of 16 Mbits.

The results of the convolution calculation processes for the impulse response data for individual blocks performed by the DSPs 32A to 32K are added by an adding device 33. The added result is supplied from the adding device 33 to the DSP 30 through a DSP 34. When the DSP 34 detects an overflow in the added result, the DSP 34 sets the data of the overflow to a predetermined value.

The DSP 30 combines the input digital audio signals, the initial reflection sound, and the result of the convolution calculation process for the impulse response data received from the DSP 34 so as to add reverberation to the input digital audio signals. Output data 35 of the DSP 30 is supplied to an output switcher 18.

The generated reverberation and non-processed input digital audio signals are referred to as “wet component” an “dry component”, respectively. The DSP 30 can vary the mixing ratio of the wet component and the dry component on each of L and R channels. In addition, the DSP 30 adjusts the levels of the output signals.

A clock signal FS or 2FS with a frequency corresponding to the sampling frequency of the handled digital audio signals is supplied to the DSP 30. The DSP 30 processes signals corresponding to the clock signal FS or 2FS.

The output switcher 18 selects an output destination of output signals under the control of the controller 40 or with a manul switch. The output signals are digital audio signals or analog audio signals. The output switcher 18 supplies digital audio signals of two channels to output terminal 20 corresponding to the AES/EBU standard through a digital outputting portion 19. The digital audio signals that are output from the output switcher 18 are supplied to a D/A converter 21. The D/A converter 21 converts the digital audio signals received from the output switcher 18 into analog audio signals. The analog audio signals on L and R channels are supplied to analog output terminals 22L and 22R, respectively.

In this example, the input terminal 10, the input terminals 13L and 13R, the output terminal 20, and the output terminals 22L and 22R are of cannon type having three signal lines of hot, cold, and ground lines.

The output switcher 18 allows the reverberation adding process in the reverberator 1 for the input audio signals to be bypassed. When the reverberation adding process is bypassed, the input digital audio signals are directly supplied to the output switcher 18 through the input switcher 12 and a bypass path 17.

All portions of the reverberator 1 are controlled by the controller 40. The controller 40 comprises for example a CPU (Central Processing Unit), a RAM (Random Access Memory), a ROM (Read Only Memory), and predetermined input/output interfaces. The ROM stores a boot program for starting up the system and serial number. The RAM is a work memory with which the CPU operates. An external program is loaded to the RAM.

The controller 40 is connected to a bus 41 with for example eight bits parallel. The bus 41 is connected to the DSP 30, 32A to 32H, and 34. The controller 40 communicates with each of the DSPs 30, 32A to 32H, and 34 through the bus 41. Thus, the controller 40 supplies programs to the DSPs 30, 32A to 32H, and 34. In addition, the controller 40 exchanges data and commands with the DSPs 30, 32A to 32H, and 34.

As described above, the input switcher 12 and the output switcher 18 are connected to for example the bus 41 (not shown) and controlled by the controller 40.

For example, a display unit 42 that is a full-dot LCD (Liquid Crystal Display) is connected to the controller 40. The display unit 42 displays data generated by the controller 40.

The inputting portion 43 has a plurality of inputting means (for example, a rotary encoder for inputting data corresponding to the rotation angle and a plurality of push switches). By operating these inputting means, relevant control signals are supplied from the inputting portion 43 to the controller 40. Corresponding to the control signals, the controller 40 supplies predetermined programs and parameters to the DSPs 30, 32A to 32H, and 34.

The reverberator 1 has a CD-ROM (Compact Disc-ROM) drive 44. A CD-ROM 45 is loaded to the CD-ROM drive 44. Data and programs are read from the CD-ROM 45. The data and programs that have been read from the CD-ROM 45 are supplied to the controller 40.

For example, impulse response data has been recorded on the CD-ROM 45. The impulse response data is read from the CD-RM 45 and supplied to the controller 40. The data is supplied from the controller 40 to the DSPs 32A to 32K. The DSPs 32A to 32K perform convolution calculation processes for impulse response data corresponding to the received impulse response data.

When many types of impulse response data that have been collected in various environments have been recorded on the CD-ROM 45, a reverberation effect for an environment corresponding to impulse response data for use can be obtained. In addition, a plurality of types of impulse response data can be used in combination. Thus, a sound space that does not really exist can be generated. In addition, the impulse response data can be edited by the reverberator 1. For example, by editing the impulse response data that is read from the CD-ROM 45 and performing the fade-out process for the impulse response data, the reverberation time can be adjusted.

As another example, data of which impulse response data is converted into frequency element data by Fourrier transform method may be recorded on the CD-ROM 45. In this case, the load of the process performed in the reverberator 1 can be reduced.

In addition, data that is displayed on the display unit 42 is recorded on the CD-ROM 45.

The reverberator 1 has an external interface MIDI (Musical Instrument Digital Interface). An MIDI signal is supplied from an MIDI input terminal 46 to the controller 40. Corresponding to the MIDI signal, the controller 40 controls a relevant function of the reverberator 1. The controller 40 generates and outputs the MIDI signal. The controller 40 can edit the MIDI signal received from the MIDI input terminal 46 and outputs the resultant signal. The MIDI signal is supplied from the controller 40 to an external apparatus through the MIDI output terminal 47. An MIDI through-terminal 48 is used to directly output the MIDI signal received from the MIDI input terminal 46.

When the option board 50 is connected to the reverberator 1, extended functions can be obtained. As an example of the extended functions, two more digital audio signals at a sampling frequency of 48 kHz can be handled. Therefore, the reverberation corresponding to the surround system as such as described above and input/output digital audio signals corresponding to the reverberation can be obtained by one unit of the reverberator 1.

As another example of the extended functions, audio signals of two channels (channels 1 and 2) can be handled at a sampling frequency of 96 kHz that is twice as high as the normal sampling frequency.

The digital audio signals of two channels (channels 3 and 4) are received from a terminal 15 through the option board 50. The digital audio signals are supplied to the input switcher 12 through the digital inputting portion 16. In addition, digital audio signals of two channels corresponding to a process of the option board 50 are output to a terminal 24 through the digital outputting portion 23. The digital audio signals are output to an external apparatus from the terminal 24 through the option board 50.

Figure 14:
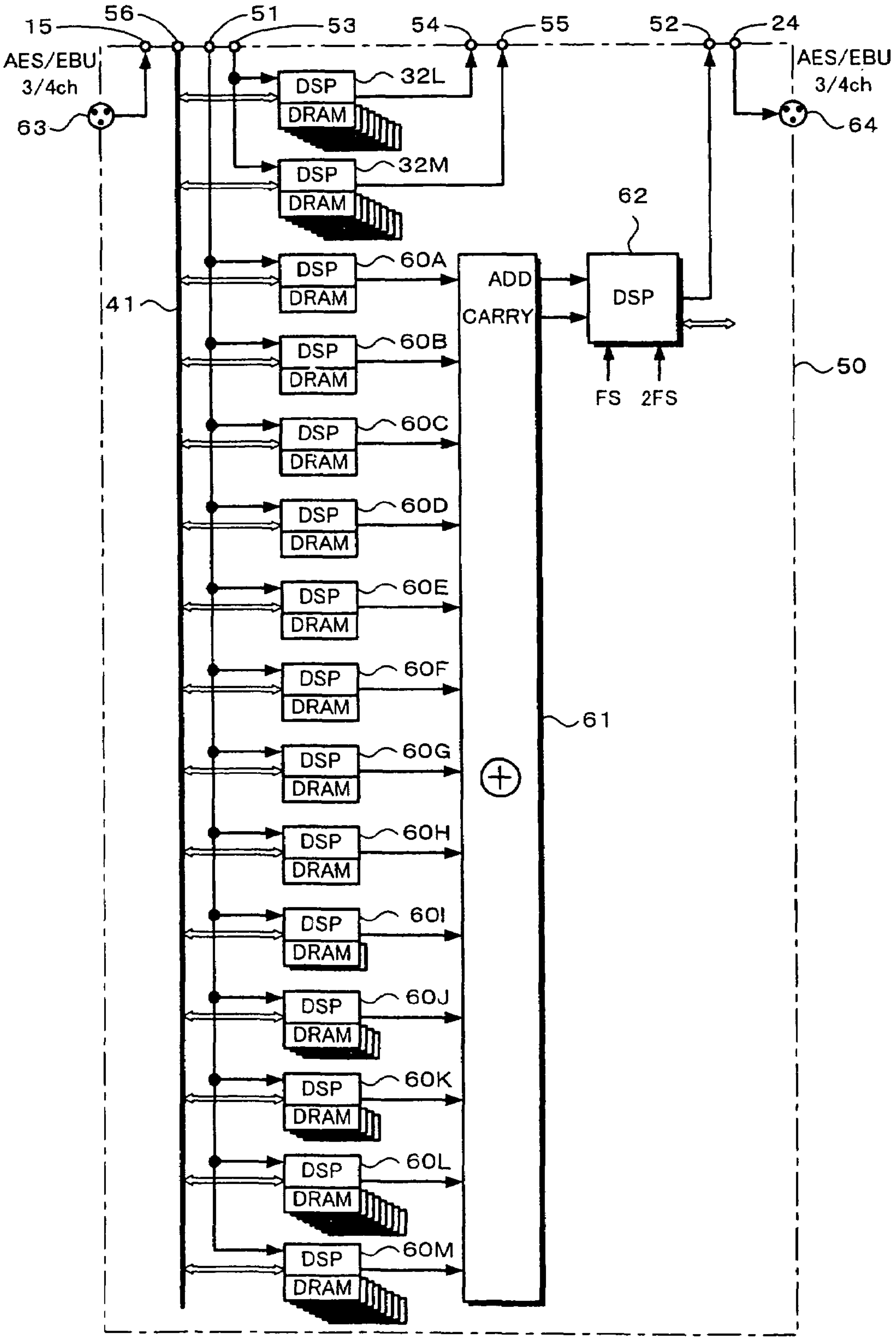
FIG. 14 is a block diagram showing an example of the structure of an option board for use with the reverberator.

The option board 50 and the reverberator 1 are connected with terminals 51 to 56, 15, and 24. FIG. 14 shows an example of the structure of the option board 50. The option board 50 performs an extended convolution calculation process for impulse response data using the DSPs 32A to 32K and the adding device 33. Thus, the option board 50 has DSPs 32L, 32M, and 60A to 60L, an adding device 61, and a DSP 62. The DSPs 32L, 32M, and 60A to 60L correspond to the DSPs 32A to 32K shown in FIG. 9, respectively. In addition, the DSP 62 corresponds to the DSP 34 shown in FIG. 9.

A bus 41' of the option board 50 is connected to the bus 41 of the reverberator 1 through a terminal 56. The DSPs 32L, 32M, and 60A to 60L of the option board 50 can communicate with the controller 40 through the bus 41'.

The DSPs 32L and 32M have eight 16-Mbit DRAMs each and perform convolutional calculation processes along with the DSPs 32A to 32K. Input digital audio signals are supplied from the DSP 30 to the DSPs 32L and 32M through the terminal 53. The results of the convolution calculation processes of the DSPs 32L and 32M are supplied to the adding device 33 through the terminals 54 and 55, respectively. The adding device 33 adds the results of the convolution calculation processes of the DSPs 32L and 32M along with the results of the convolution calculation processes of the other DSPs 32A to 32K.

On the other hand, the DSPs 60A to 60M perform the convolution calculation processes in parallel with those of the DSPs 32A to 32M shown in FIG. 9. Input digital audio signals are supplied from the DSP 30 to the DSPs 60A to 60M through the terminal 51.

When digital audio signals of four channels (channels 1 to 4) are processed with the option board 50, the DSPs 32A to 32M perform convolution calculation processes for digital audio signals of channels 1 and 2, whereas the DSPs 60A to 60M perform convolution calculation processes for digital audio signals of channels 3 and 4. When digital audio signals at a sampling frequency of 96 kHz are handled, pairs of DSPs (for example a pair of the DSPs 32A and 60A, a pair of the DSPs 32B and 60B, . . . , and a pair of the DSPs 32M and 60M) that receive blocks with respective samples can perform respective convolution calculation processes in parallel at double speed.

The results of the convolution calculation processes of the DSPs 60A to 60M are supplied to the adding device 61. The added result of the adding device 61 is supplied to the DSP 62. As with the DSP 34, the DSP 62 performs an overflow process. The resultant signals are supplied to the DSP 30 through the terminal 52. The DSP 30 adjusts the ratio of a dry component and a wet component and the mixing ratio of signals of individual channels and supplies the resultant data to the output switcher 18.

The option board 50 also has a digital audio signal input terminal 63 and a digital audio signal output terminal 64 corresponding to AES/EBU standard. Signals of two channels (channel 3 and 4) are input to the input terminal 63. The input signals are supplied to the input switcher 12 through the terminal 15. Likewise, output signals of two channels (channels 3 and 4) are supplied from the output switcher 18 to the option board 50 through the terminal 24 and then output from the output terminal 64. In this example, the terminals 63 and 64 are of cannon type.

Figure 15:
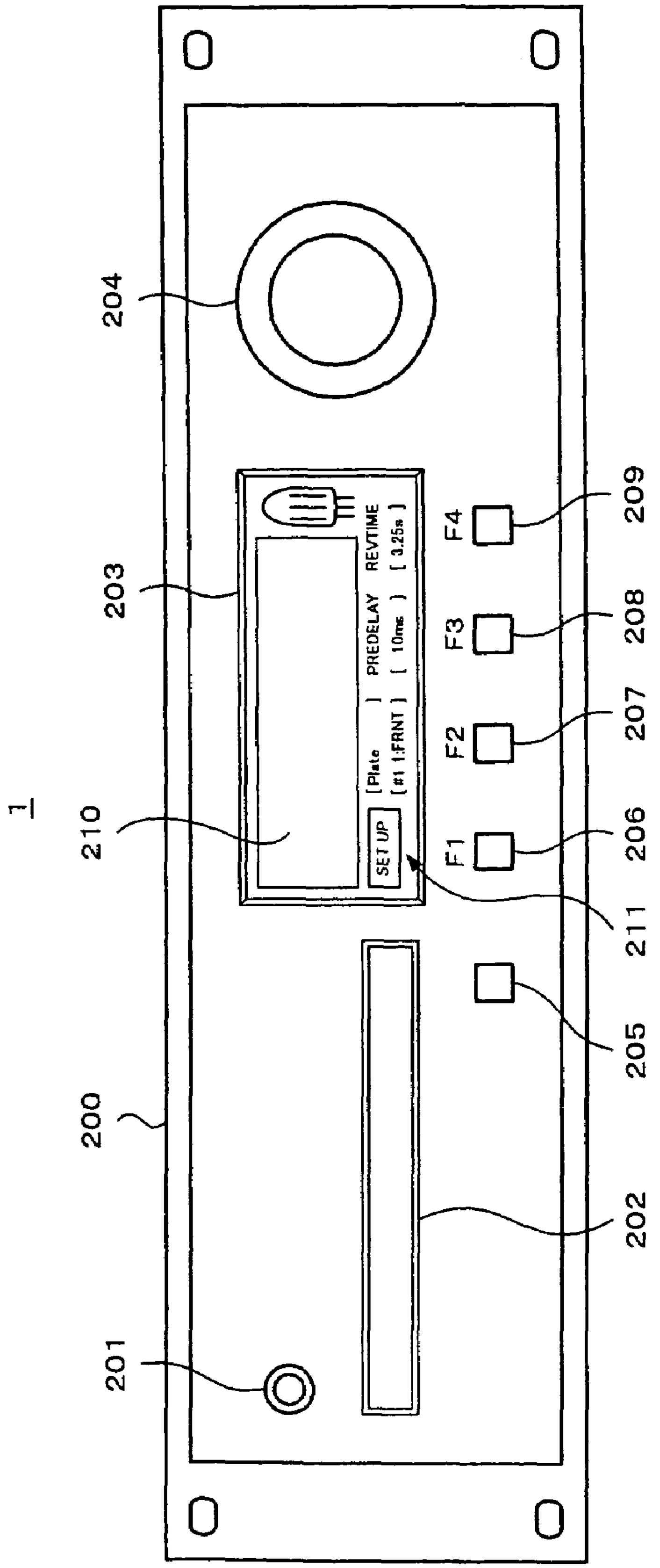
FIG. 15 is a schematic diagram showing an example of the structure of a front panel of the reverberator.
Figure 16A:
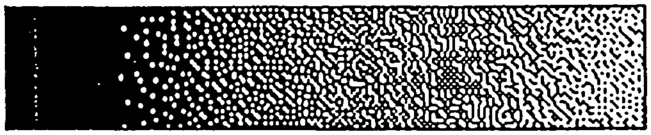
FIGS. 16A to 16H are schematic diagrams showing examples of ripples displayed in a display area.
Figure 16B:
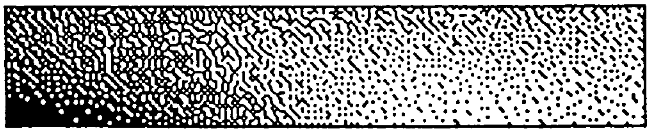
Figure 16C:
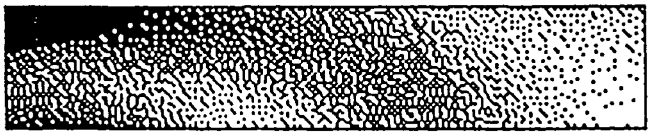
Figure 16D:
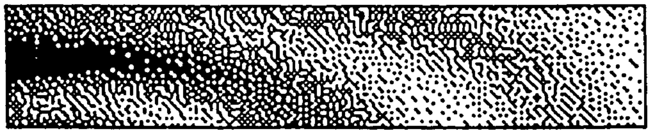
Figure 16E:
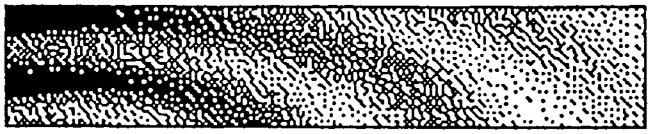
Figure 16F:
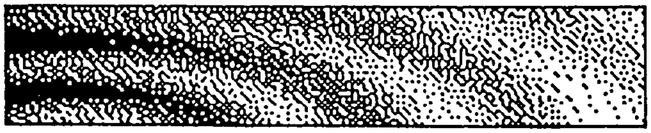
Figure 16G:
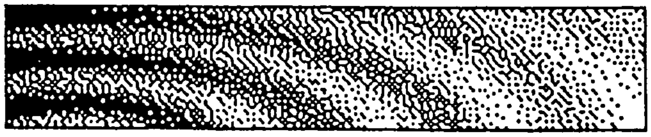
Figure 16H:
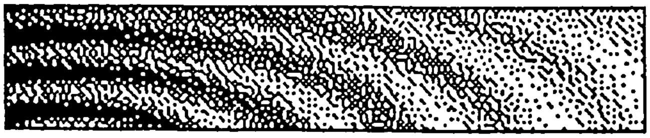
Figure 17A:
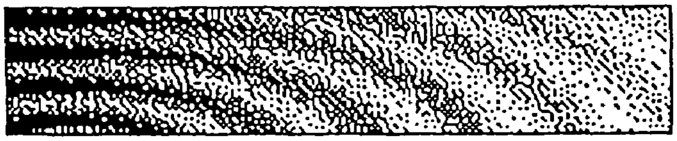
FIGS. 17A to 17H are schematic diagrams showing examples of ripples displayed in the display area.
Figure 17B:
Figure 17C:
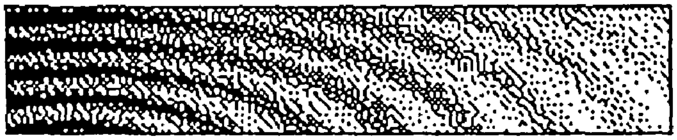
Figure 17D:
Figure 17E:
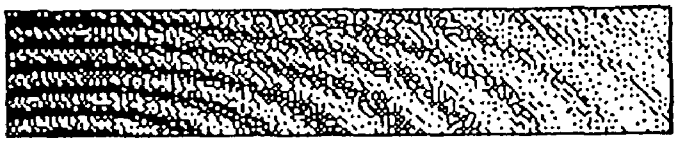
Figure 17F:
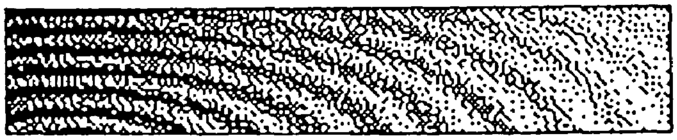
Figure 17G:
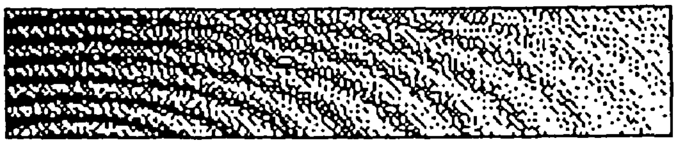
Figure 17H:

FIG. 15 shows an example of a front panel 200 of the reverberator 1. Four mounting holes are formed at four corners of the front panel 200. With the four mounting holes, the reverberator 1 can be mounted to a rack. A power switch 201 is disposed on the left of the panel 200. Below the power switch 201, a CD-ROM loading portion 202 is disposed. A CD-ROM 45 is loaded to a CD-ROM drive 44 through the CD-ROM loading portion 202. With a switch 205, the CD-ROM 45 is loaded and unloaded to/from the CD-ROM drive 44 through the CD-ROM loading portion 202.

A display portion 203 is disposed at a nearly center position of the panel 200. The display portion 203 corresponds to the LCD 42 shown in FIG. 9. On the right of the display portion 203, a rotary encoder 204 is disposed. Below the display portion 203, function keys 206, 207, 208, and 209 are disposed. With the rotary encoder 204 and the function keys 206 to 209, the user can select one of the functions of the reverberator 1 and input data thereto.

The display portion 203 displays various data corresponding to the selected function. In this example, the display portion 203 displays parameters corresponding to a selected reverberation type. The display portion 203 is largely separated into a display area 210 and a display area 211. The display area 210 visually displays parameters corresponding to the selected reverberation type. The display area 211 displays parameter names and parameter values.

Data displayed in the display area 211 corresponds to the function switches 206 to 209 disposed below the display portion 203. When one of the function switches 206 to 209 is pressed, a parameter displayed above the function switch that has been pressed is selected. By turning the rotary encoder 204, the value of the selected parameter is varied. Another page can be displayed on the display portion 203. On another page, the value of another parameter can be varied.

In the embodiment, the display area 210 displays ripples corresponding to a parameter that is being currently set. Thus, the user can visually know the effect of reverberation (spatial impression) corresponding to the parameter value. FIGS. 16A to 16H and FIGS. 17A to 17H show examples of ripples displayed in the display area 210. As the reverberation time is prolonged, the number of wavers of ripples is increased in the order from FIGS. 16A to 16H to FIGS. 17A to 17H.

In this example, the ripples are displayed in 16 levels of the minimum value to the maximum value of the reverberation time. The ripples in 16 levels are proportional to the reverberation time. Ripple display data is stored in the CD-ROM 45. When the reverberator 1 gets started, ripple display data is read from the CD-ROM 45 and stored in the RAM of the controller 40. Alternatively, the ripple display data may be pre-stored in the ROM of the controller 40. Once the parameter value of the reverberation time is set, ripples are displayed corresponding to the parameter value that has been set.

When ripples are displayed in the display area 210, the user can visually know the effect of the reverberation that has been set. In other words, the user can visually know the spatial impression of the reverberation with ripples displayed in the display area 210.

Figure 18A:
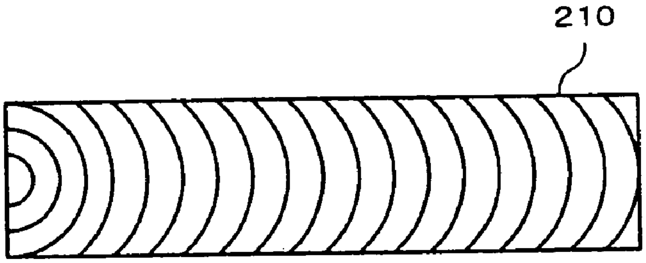
FIGS. 18A to 18C are schematic diagrams showing other examples of ripples displayed in the display area.
Figure 18B:
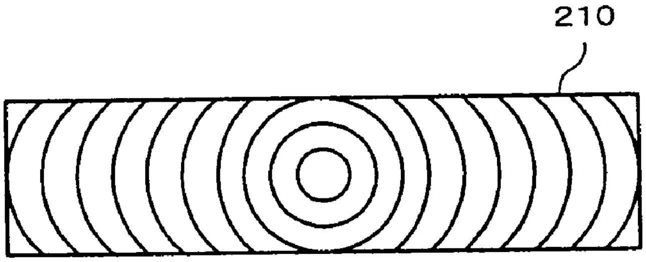
Figure 18C:
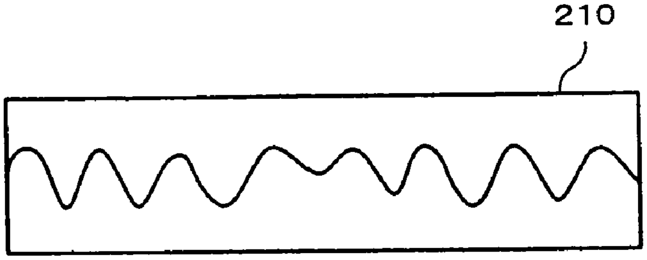

In the example, ripples are displayed in the upper right direction of the display area 210. However, ripples may be displayed with a different pattern. FIGS. 18A, 18B, and 18C show other examples of ripples displayed in the display area 210. The center point and spreading direction of ripples can be freely set. The center position of ripples can be set at the left end of the display area 210 (see FIG. 18A). Alternatively, the center position of ripples can be set at the center of the display area 210 (see FIG. 18B). A section of ripples may be displayed in the display area 210 (see FIG. 18C). In addition, the shape of ripples can be varied corresponding to the selected reverberation type. In this example, ripples are displayed as a still pattern. However, when a plurality of pages of ripple display data is prepared for each parameter and they are successively displayed, ripples can be displayed as an animated pattern.

Next, convolution calculation processes for impulse response data performed by the DSPs 32A to 32M and the DSPs 60A to 60M will be described. In this example, for simplicity, only convolution calculation processes performed by only the DSPs 32A to 32K without the use of the option board 50 will be described.

Figure 19:
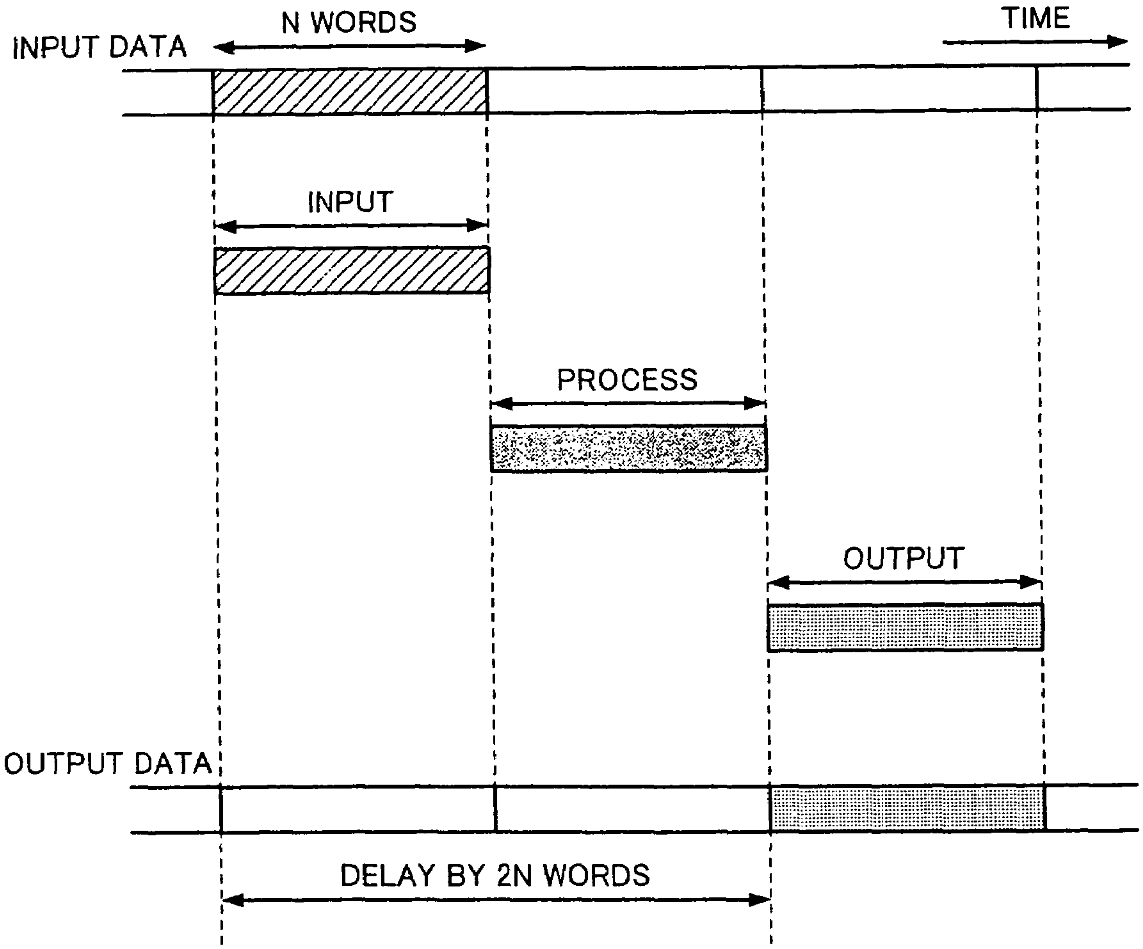
FIG. 19 is a schematic diagram showing a process performed in each DSP that performs a convolution calculation process.

FIG. 19 shows a process performed by each of the DSPs 32A to 32K. Impulse response data is read from for example the CD-ROM 45 under the control of the controller 40 and supplied to the DSPs 32A to 32K. The impulse response data that is read from the CD-ROM 45 is stored to the DRAMs of the DSPs 32A to 32K. Each of the DSPs 32A to 32K divides impulse response data at predetermined intervals on time axis corresponding to the process block sizes assigned thereto.

For simplicity, a DSP 32 that represents all the DSPs 32A to 32K will be described. The data unit of impulse response data processed by the DSP 32 is denoted by N. In this example, since the DSP 32A performs a convolution calculation process for impulse response data of 128 points, the data unit N is 128. In the following description, one word corresponds to data of one sample of a digital audio signal. Thus, one word has a time period of (1/sampling frequency). The number of quantizing bits of digital data is 24 bits.

Input data supplied to the DSP 32 is divided as block data of N words. Thus, the time period for the first N words is the time period for inputting the data. The input data of N words is stored to the DRAM of the DSP 32. In the time period of the next N words, a convolution calculation process is performed for impulse response data corresponding to input data of N words stored in the DRAM. After the convolution calculation process is completed, the result of the process for N words is output. Thus, in the process for N words, output data is delayed by 2N words to input data.

Figure 20:
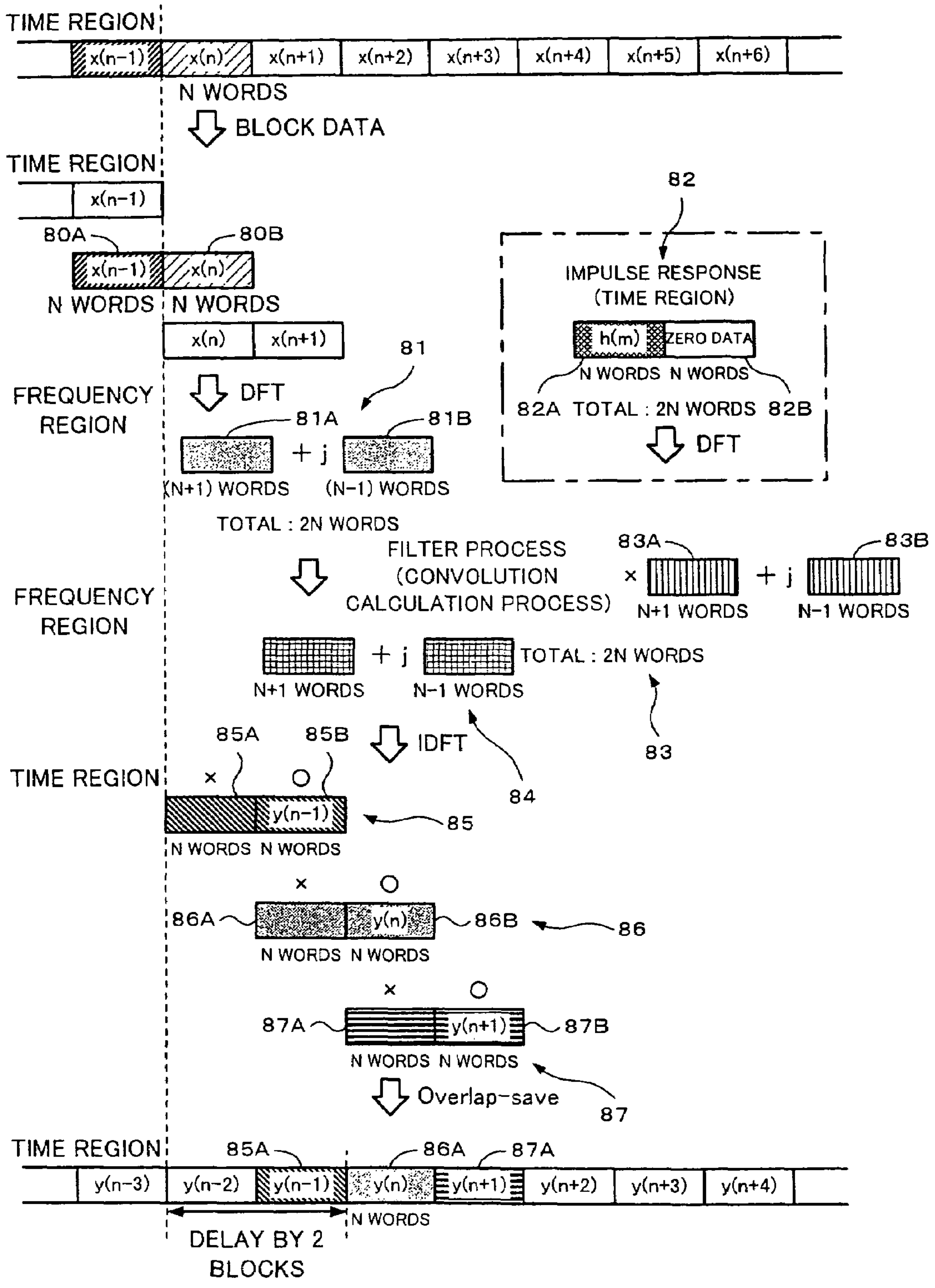
FIG. 20 is a schematic diagram showing the details of the process performed in each DSP.

FIG. 20 shows the process of the DSP 32 in detail. The DSP 32 performs a convolution calculation process for impulse response data by known recursive convolution overlap save method.

In other words, as shown in FIG. 20, an n-th block 80B and an (n−1)-th block 80A that immediately precedes the block 80B are supplied every N words on time axis. The n-th block 80B and the (n−1)-th block 80A are converted into frequency element data 81 composed of a real part 81A of (N+1) words and an imaginary part 81B of (N−1) words by DFT (Discrete Fourier Transform) method.

On the other hand, real data 82A and zero data 82B of impulse response data 82 have been converted into frequency element data 83 composed of a real part 83A of (N+1) words and an imaginary part 83B of (N−1) words by DFT method.

The real part and imaginary part of frequency element data 81 of the input data and the real part and imaginary part of the frequency element data 83 of the impulse response are multiplied, respectively. The multiplied results of the same frequency components are added. Namely, filter process (convolution calculation process) is performed. Thus, frequency element data 84 composed of a real part 84A of (N+1) words and an imaginary part of (N−1) words is obtained. The IDFT process that is an inverse process of the DFT process is performed for the frequency element data 84. Thus, data 86 of 2N words on time axis is obtained.

As the results of the IDFT process, as represented by data 85, 86, and 87 shown in FIG. 20, blocks of 2N words are obtained at intervals of N words. The first N word portions 85A, 86A, and 87A of the data 85, 86, and 87 are discarded. Thus, output data of (n−1)-th block, n-th block, and (n+1)-th block is obtained. Consequently, the n-th output data is delayed by 2 blocks against the n-th input data.

When the block size is increased, a convolution calculation process is performed for more impulse response data. Thus, a longer reverberation time can be obtained. However, as described above, an output block is delayed by two blocks against an input block. Consequently, when the size of each block is increased, the delay time of an output component of the reverberation process adversely becomes long. To solve such a problem, according to the embodiment of the present invention, a process for obtaining a desired reverberation time is performed in parallel for a plurality of blocks each of which is composed of a predetermined number of points (words).

Figure 21:
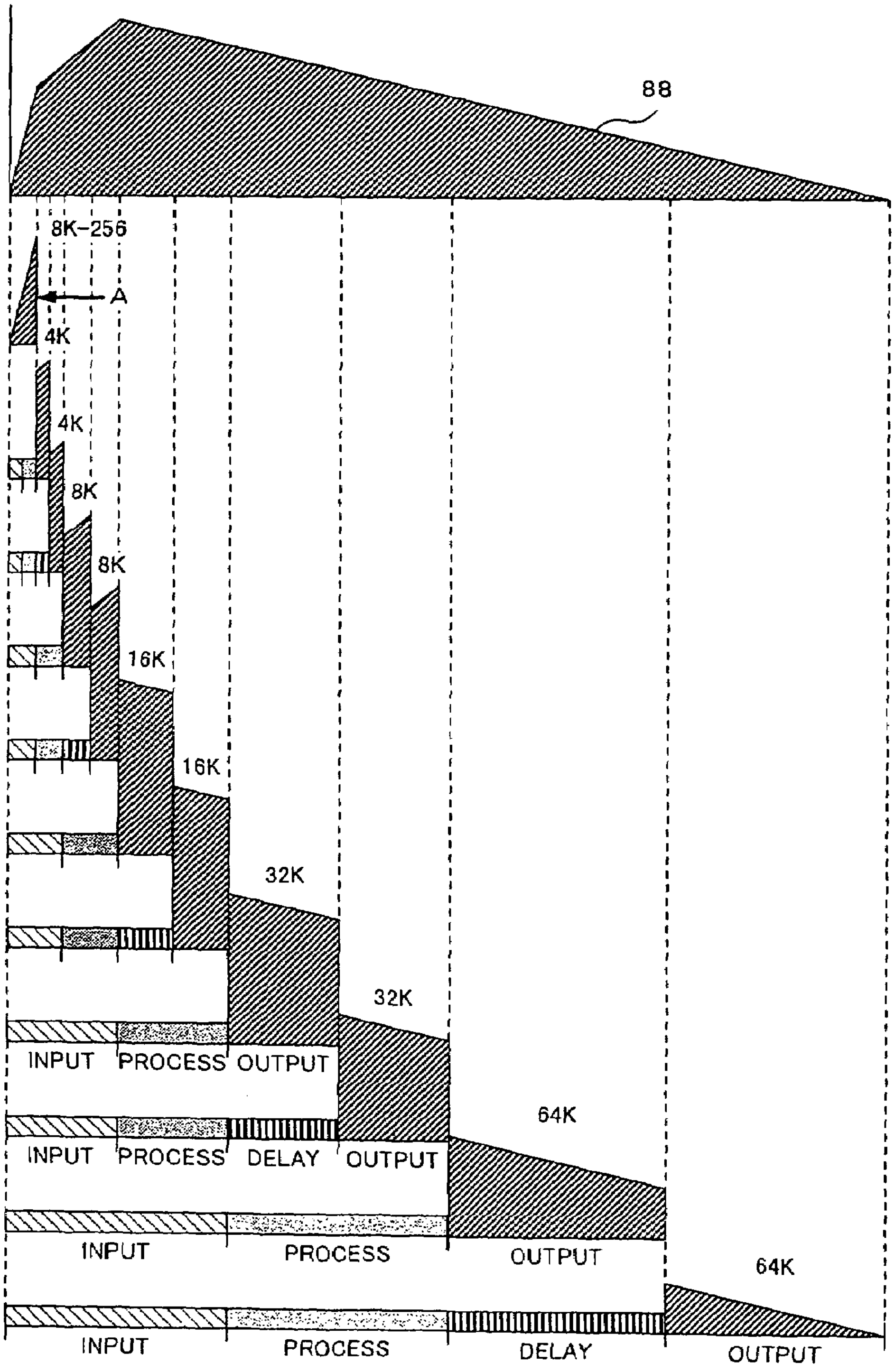
FIG. 21 is a schematic diagram showing a convolution calculating process for each divided block.
Figure 22:
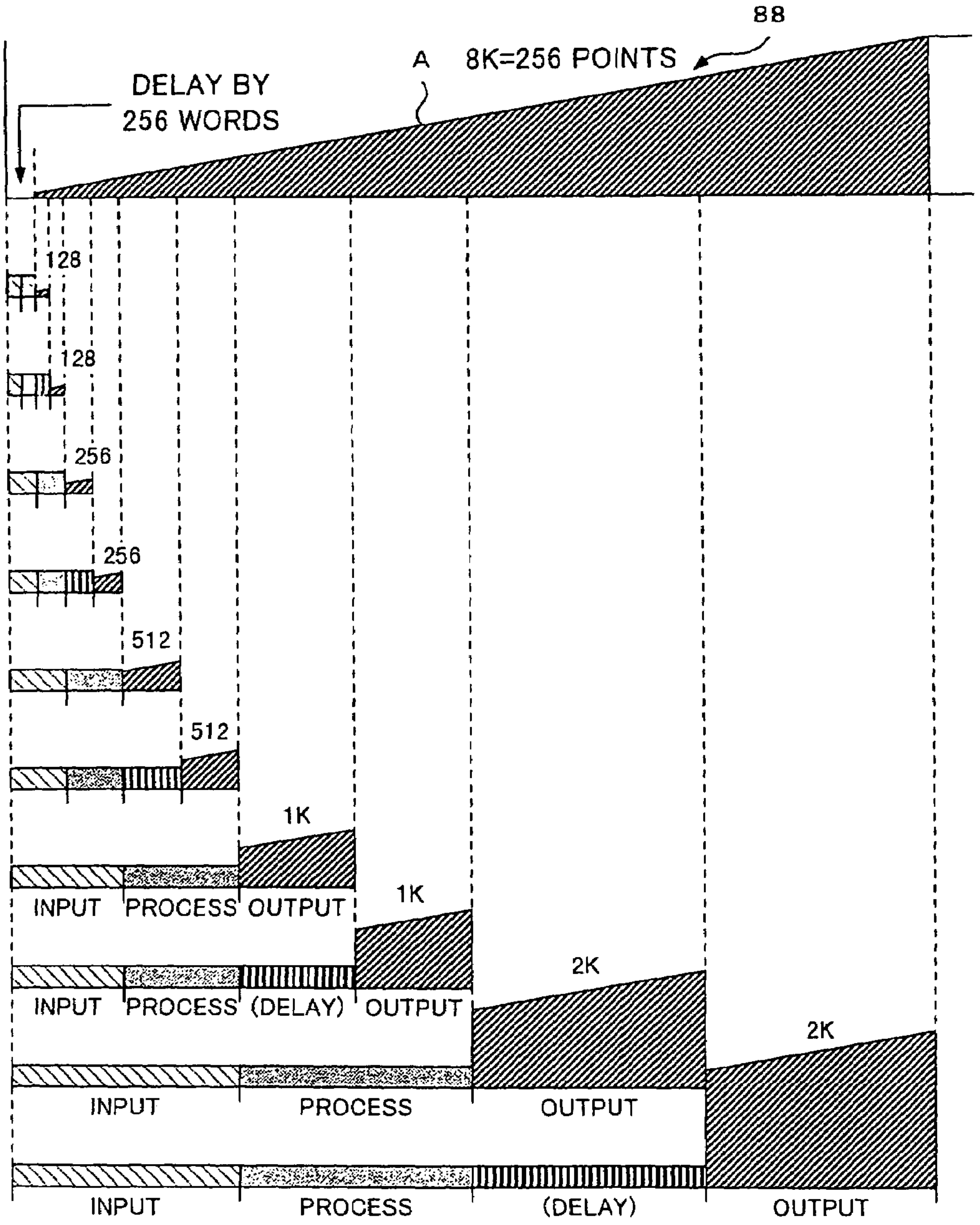
FIG. 22 is a schematic diagram showing a convolution calculating process for each divided block.

FIGS. 21 and 22 show a convolution calculation process according to the embodiment of the present invention. In the convolution calculation process, a digital audio signal is divided to a plurality of blocks. For example, a convolution calculation process for $2^{18}$ words (256 k words) is considered. In this case, a convolution calculation process is performed for a digital audio signal with impulse response data of 256 k words (256 k points). When the sampling frequency is 48 kHz, a reverberation time of around 5.3 seconds is obtained. When the sampling frequency is 44.1 kHz, a reverberation time of around 5.9 seconds is obtained.

As shown in FIG. 21, the impulse response data of 256 k words is divided into two portions. The temporally earlier portion of the two portions is further divided into two portions. In such a manner, the earlier portion on time axis is successively divided into two portions. The later portion on time axis is successively divided into two portions. Thus, two blocks with the same size are formed.

FIG. 22 is an enlarged view showing a top portion A of 8 k words shown in FIG. 21. Likewise, the portion A is divided into two portions. The first 256-words portion is divided into two blocks each of which has 128 words. A convolution calculation process is performed for impulse response data of the two blocks. Thus, the reverberation component is delayed by 256 words of the first portion. However, when the sampling frequency is 48 kHz, the delay is as small as 5 msec. Thus, it does not adversely affect reverberation.

In the case of $2^{18}$ words (256 k words), a pair of two $2^7$ words (128 words) blocks, a pair of two $2^8$ words (256 words) blocks, a pair of two $2^9$ words (512 words) blocks, a pair of two $2^{10}$ words (1 k words) blocks, a pair of two $2^{11}$ words (2 k words) blocks, a pair of two $2^{12}$ words (4 k words) blocks, a pair of two $2^{13}$ words (8 k words) blocks, a pair of two $2^{14}$ words (16 k words) blocks, a pair of two $2^{15}$ words (32 k words) blocks, and a pair of two $2^{16}$ words (64 k words) blocks (namely, pairs of two $2^n$ a words blocks) are formed.

Each of the DSPs 32A to 32K performs a convolution calculation process for the relevant pair with the same block size. In other words, as shown in FIGS. 21 and 22, the DSPs 32A to 32K divide their input data as follows. The DSP 32A divides the input data into blocks each of which is composed of 128 words. The DSP 32B divides the input data into blocks each of which is composed of 256 words. The DSP 32C divides the input data into blocks each of which is composed of 512 words. The DSP 32D divides the input data into blocks each of which is composed of 1 k words. The DSP 32E divides the input data into blocks each of which is composed of 2 k words. The DSP 32F divides the input data into blocks each of which is composed of 4 k words. The DSP 32G divides the input data into blocks each of which is composed of 8 k words. The DSP 32H divides the input data into blocks each of which is composed of 16 k words. The DSP 32I divides the input data into blocks each of which is composed of 32 k words. Each of the DSPs 32J and 32K divides the input data into blocks each of which is composed of 64 k words.

For a convolution calculation process for blocks in the range from 128 words to 32 k words, each DSP performs the process for a pair of blocks with the same block size on time division basis.

In other words, each of the DSPs 32A to 32K performs a convolution calculation process for divided block data with relevant impulse response data. The second pair member of each pair is delayed by one block against the first pair member. Thus, each of the DSPs 32A to 32K successively outputs two blocks with the same block size. The adding device 33 adds the output blocks of the DSPs 32A to 32K and generates reverberation data 88.

When input data is successively processed by the DSPs 32A to 32K in their assigned periods and the results are added, reverberation can be added to the successive data.

Figure 23:
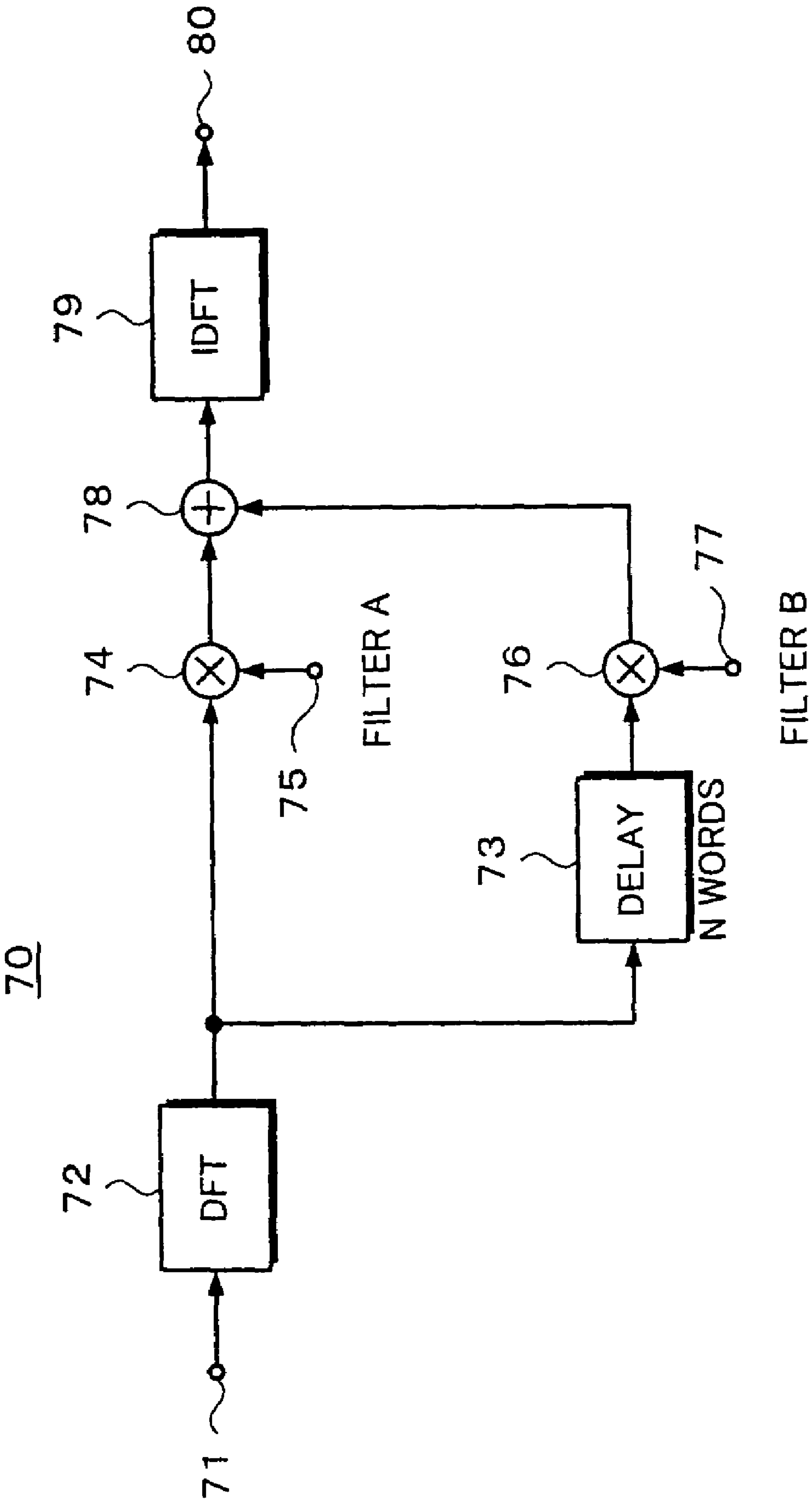
FIG. 23 is a block diagram showing an example of the structure of a convolution calculation filter of each DSP.

FIG. 23 shows an example of the structure of a convolution calculation filter 70 used in each of the DSPs 32A to 32K. The convolution calculation filter 70 performs a convolution calculation process. The convolution calculation filter 70 is accomplished by a predetermined program supplied from the controller 40 to the DSPs 32A to 32K. Referring to FIG. 23, a digital audio signal is input from a terminal 71. The input digital audio signal is supplied to a DFT circuit 72. The DFT circuit 72 converts the digital audio signal on time axis into frequency element data. Output data of the DFT circuit 72 is supplied to a multiplying device 74 and a delaying circuit 73.

The delaying circuit 73 delays the input digital audio signal by N words. In other words, the DSPs 32A, 32B, 32C, 32D, 32E, 32F, 32G, 32H, 32I, and 32K have delay amounts of N=128, 256, 512, 1 k, 2 k, 4 k, 8 k, 16 k, 32 k, and 64 k, respectively. Data delayed by the delaying circuit 73 is supplied to a multiplying device 76.

The multiplying device 74 receives a filter coefficient A from a terminal 75. The filter coefficient A is impulse response data that has been processed by DFT method. The multiplying device 74 multiplies the output data of the DFT circuit 72 by the relevant frequency element of the filter coefficient A. Likewise, the multiplying device 76 performs the same process as the multiplying device 74. In other words, the multiplying device 76 receives a filter coefficient B from a terminal 77. The filter coefficient B is impulse response data that has been processed by DFT method. The multiplying device 76 multiplies the output data of the delaying circuit 73 by the relevant frequency element of the filter coefficient B.

The multiplied results of the multiplying devices 74 and 76 are added by an adding device 78. The added result is supplied to an IDFT circuit 79. The IDFT circuit 79 converts the frequency element data into data on time axis and outputs the resultant data from a terminal 80.

Since the convolution calculation filter 70 performs a convolution calculation process for two blocks of data of which one block is delayed by N words (namely, one block) against the other block and outputs data of two blocks. As was described with reference to FIG. 16, the first pair member of each pair is discarded.

Figure 24:
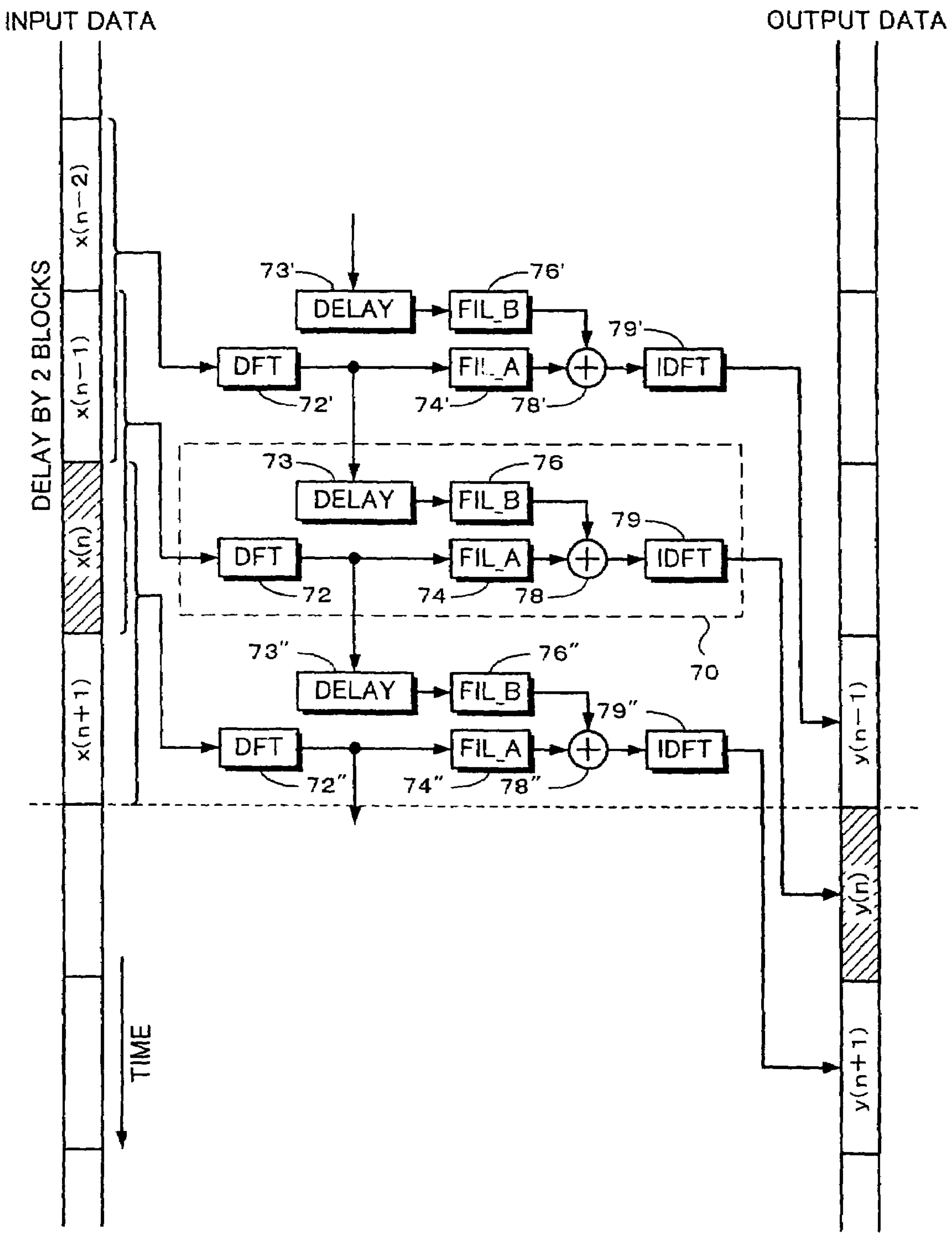
FIG. 24 is a schematic diagram showing a process of a convolution calculation filter on time axis.

FIG. 24 shows a process on time axis performed by the convolution calculation filter 70 shown in FIG. 23. The left end and right end of FIG. 24 show input data and output data, respectively. It is assumed that in FIG. 24, time passes downwards. Referring to FIG. 24, a plurality of filters 70 are shown. However, in reality, these processes are performed by one filter 70 at different timings. Thus, the result of the DFT process at the preceding timing is delayed by the delaying circuit 73. The delayed result is used for the filter process at the next timing. Consequently, output data delayed by two blocks against input data is successively obtained.

Figure 25:
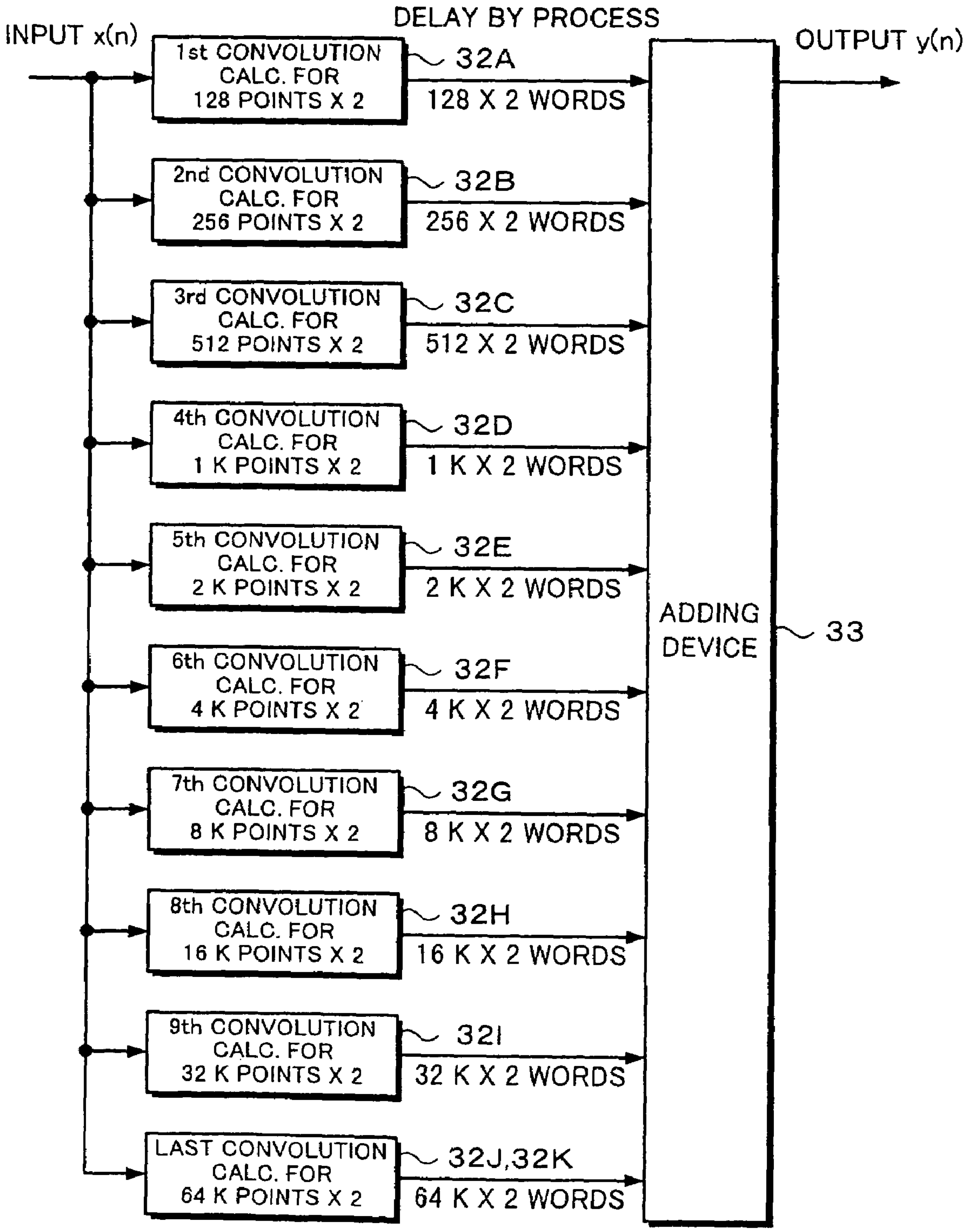
FIG. 25 is a schematic diagram showing parallel processes for N words.

FIG. 25 is a functional block diagram showing an outline of parallel processes of the DSPs 32A to 32K. Input data is supplied to the DSPs 32A to 32K in parallel. The DSPs 32A, 32B, 32C, 32D, 32E, 32F, 32G, 32H, 32I, 32J, and 32K perform convolution calculation processes for N=128 points, N=256 points, N=512 points, N=1 k points, N=2 k points, N=4 k points, N=8 k points, N=16 k points, N=32 k points, and K=64 k points, respectively. Each of the calculated results of the DSPs 32A to 32K is delayed by 2 N words. The delayed results are supplied to an adding device 22.

For example, the DSP 32A divides input data into blocks each of which is composed of N=128 words, performs a convolution calculation process for the divided blocks, and outputs the calculated result that has been delayed by 2N words against the input data. Thereafter, the DSP 32A receives the next blocks each of which is composed of N words and repeats the same process for the blocks. This process applies to each of the DSPs 32B to DSP 32K.

In the embodiment, the impulse response collecting apparatus 97 is independent from the reverberator 1. However, it should be noted that the present invention is not limited to such a structure. In other words, the reverberator 1 may have a measurement signal generating portion 90, a synchronously adding portion 94, and an impulse response converting portion 95. The measurement signal generating portion 90 generates a TSP signal. These portions can be composed of a CPU and several peripheral parts. Alternatively, the DSP 30 and DSP 34 of the reverberator 1 may be used. When the reverberator 1 has a function for collecting impulse response data, the user can obtain an original sound effect.

In the embodiment, the convolution calculation process for impulse response data is performed by hardware such as DSPs 32A to 32K. However, it should be noted that the convolution calculation process may be performed by software. Likewise, the processes of the DSPs 30 and 34 may be performed by software.

As described above, according to the second aspect of the present invention, a convolution calculation process is performed for impulse response data that is measured in a real space or with a steel-plate echo apparatus so as to generate reverberation. Thus, a natural and high quality result can be obtained.

In other words, according to the present invention, the pitch of reverberation becomes the same as the pitch of input sound.

In addition, according to the present invention, impulse response data is measured with a TSP signal a plurality of times. The obtained results are synchronously added. Thus, reverberation with a higher S/N ratio can be accomplished than that with a real steel-plate echo apparatus or in a real space.

In addition, according to the present invention, by editing impulse response data obtained with a steel-plate echo apparatus or in a real space, the reverberation time which is impossibly implemented with a running time or a real steel-plate echo apparatuses that can be adjusted.

In addition, according to the present invention, by combining impulse response data obtained with different steel-plate echo apparatuses and/or in real spaces, an apparatus and/or a space that does not really exist can be accomplished.

In addition, according to the present invention, when impulse response data is measured in the best condition, it is not necessary to perform a maintenance work unlike with a real steel-plate echo apparatus or a real hall.

In addition, according to the present invention, since reverberation is added using impulse response data measured in a real space or with a steel-plate apparatus, the current reverberation can be quickly substituted with reverberation in another space or with another apparatus.

Likewise, the current reverberation can be quickly substituted with reverberation recorded with another microphone.

In addition, according to the embodiment of the present invention, high quality reverberation can be accomplished with an apparatus that is lighter and compacter than a real steel-echo apparatus or that is easily than that in a real hall.

In addition, according to the present invention, by measuring impulse response data obtained with a curious apparatus or in a space of a hall that will be destroyed and recording the measured data to a record medium, the recorded data can be reproduced later.

In addition, according to the embodiment of the present invention, when the reverberator has a function for collecting impulse response data, the user can obtain a unique sound effect.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method for creating an impulse response, comprising the steps of:

creating a vibration from a signal including a repeated signal;

wherein said vibration includes a first channel and a second channel configured to produce one of stereo input signals and spatial input signals;

measuring the vibration;

synchronously adding the measured vibration in time with generation timing of the repeated signal;

converting the synchronously added measured vibrations into an impulse response;

storing the impulse response; and repeating said steps of creating a vibration, measuring, synchronously adding, converting, and storing for each of at least one of a plurality of sources of said vibration and a plurality of varied positions of the sources of said vibration;

wherein:

said step of synchronously adding removes random noise by only adding reproducible portions of the measured vibration; and said step of converting comprises performing a convolution calculation process.

2. The method according to claim 1, wherein said plurality of sources comprises a plurality of individual speaker brands.

3. The method according to claim 1, further comprising the step of selecting one of the stored impulse responses for use as a reverberation.

4. A method for generating a reverberation response signal, the method comprising:

generating a digital time stretched pulse (TSP) signal N times;

converting the digital TSP signal to an analog input signal;

creating a vibration signal from the analog input signal, wherein the vibration signal includes at least a left channel and a right channel;

converting the vibration signal to a digital signal, including at least a left channel digital signal and a right channel digital signal;

synchronously adding N output signals for each channel;

converting the synchronously added signal to an impulse response signal for each channel, wherein the impulse response signal is representative of a reverberation response of an environment; and storing the impulse response signal from each channel to a recording medium.

5. The method of claim 4, further comprising editing the impulse response signal from each channel.

6. The method of claim 4, wherein the impulse response signal is applied to an audio signal in order to reproduce a reverberation signal with the audio signal.

7. An apparatus for recording a reverberation response signal, the apparatus comprising:

a signal generator that generates a digital time stretched pulse (TSP) signal N times;

a digital-to-analog converter connected to the signal generator;

a vibration signal generator connected to the digital-to-analog converter, and generating at least a left channel signal and a right channel signal;

an analog-to-digital converter connected to the at least left channel and right channel signals;

an adder connected to the analog-to-digital converter to synchronously add N output signals for each channel;

an impulse response signal converter connected to the adder to convert the synchronously added signals for each channel into an impulse response signal for each channel wherein the impulse response signal is representative of a reverberation response of an environment; and a storage medium to store the impulse response signal for each channel.

* * * * *